United States Patent
Le et al.

(10) Patent No.: US 10,720,508 B2
(45) Date of Patent: Jul. 21, 2020

(54) FABRICATION OF MULTI-CHANNEL NANOWIRE DEVICES WITH SELF-ALIGNED INTERNAL SPACERS AND SOI FINFETS USING SELECTIVE SILICON NITRIDE CAPPING

(71) Applicant: Intel Corporation, Santa Clara, CA (US)

(72) Inventors: Van H. Le, Portland, OR (US); Scott B. Clendenning, Portland, OR (US); Martin M. Mitan, Beaverton, OR (US); Szuya S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/750,158

(22) PCT Filed: Sep. 25, 2015

(86) PCT No.: PCT/US2015/052451
§ 371 (c)(1),
(2) Date: Feb. 2, 2018

(87) PCT Pub. No.: WO2017/052644
PCT Pub. Date: Mar. 30, 2017

(65) Prior Publication Data
US 2018/0226490 A1    Aug. 9, 2018

(51) Int. Cl.
*H01L 29/66* (2006.01)
*H01L 21/02* (2006.01)
(Continued)

(52) U.S. Cl.
CPC ........ *H01L 29/66553* (2013.01); *B82Y 10/00* (2013.01); *H01L 21/0217* (2013.01);
(Continued)

(58) Field of Classification Search
CPC ........... H01L 21/0217; H01L 21/02247; H01L 29/0673; H01L 29/66545; H01L 29/66553; H01L 29/6681
See application file for complete search history.

(56) References Cited

U.S. PATENT DOCUMENTS

2014/0001441 A1 * 1/2014 Kim ................... H01L 29/0673
257/29
2014/0014904 A1    1/2014 Cohen et al.
(Continued)

OTHER PUBLICATIONS

International Preliminary Search Report for International Patent Application No. PCT/US2015/052451, dated Apr. 5, 2018, 11 pages.
(Continued)

*Primary Examiner* — David C Spalla
(74) *Attorney, Agent, or Firm* — Schwabe, Williamson & Wyatt, P.C.

(57) ABSTRACT

Methods of selectively nitriding surfaces of semiconductor devices are disclosed. For example, a hardmask is formed on the top portion of the fins to create SOI structure. The hardmask may be formed by nitriding the top portion of the fin. In other embodiments, silicon nitride is grown on the top portion of the fin to form the hard masks. In another example, internal spacers are formed between adjacent nanowires in a gate-all-around structure. The internal spacers may be formed by nitriding the remaining interlayer material between the channel region and source and drain regions.

15 Claims, 20 Drawing Sheets

(51) Int. Cl.
*H01L 29/06* (2006.01)
*H01L 29/78* (2006.01)
*B82Y 10/00* (2011.01)
*H01L 29/423* (2006.01)
*H01L 29/775* (2006.01)
*H01L 29/786* (2006.01)
*H01L 21/762* (2006.01)

(52) U.S. Cl.
CPC .. *H01L 21/02164* (2013.01); *H01L 21/02238* (2013.01); *H01L 21/02247* (2013.01); *H01L 21/02252* (2013.01); *H01L 29/0653* (2013.01); *H01L 29/0673* (2013.01); *H01L 29/42392* (2013.01); *H01L 29/6681* (2013.01); *H01L 29/66439* (2013.01); *H01L 29/66545* (2013.01); *H01L 29/66818* (2013.01); *H01L 29/775* (2013.01); *H01L 29/785* (2013.01); *H01L 29/7853* (2013.01); *H01L 29/78696* (2013.01); *H01L 21/76224* (2013.01)

(56) References Cited

U.S. PATENT DOCUMENTS

2014/0151638 A1 6/2014 Chang et al.
2015/0137237 A1 5/2015 Jacob et al.
2015/0200300 A1 7/2015 Ching et al.

OTHER PUBLICATIONS

Office Action from Taiwan Patent Application No. 105126253, dated Nov. 25, 2019, 9pgs.
Notice of Allowance from Taiwan Patent Application No. 105126253, dated Mar. 20, 2020, 3 pgs.
International Search Report and Written Opinion for International Patent Application No. PCT/US2015/052451 dated Jun. 20, 2016, 12 pgs.

* cited by examiner

FABRICATION OF MULTI-CHANNEL NANOWIRE DEVICES WITH SELF-ALIGNED INTERNAL SPACERS AND SOI FINFETS USING SELECTIVE SILICON NITRIDE CAPPING

CROSS-REFERENCE TO RELATED APPLICATION

This patent application is a U.S. National Phase Application under 35 U.S.C. § 371 of International Application No. PCT/US2015/052451, filed Sep. 25, 2015, entitled "FABRICATION OF MULTI-CHANNEL NANOWIRE DEVICES WITH SELF-ALIGNED INTERNAL SPACERS AND SOI FINFETS USING SELECTIVE SILICON NITRIDE CAPPING," which designates the United States of America, the entire disclosure of which is hereby incorporated by reference in its entirety and for all purposes.

FIELD OF THE INVENTION

Embodiments of this invention relate to the field of semiconductor devices and more particularly to multi-gate devices.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The further reduction in scale of integrated circuit devices has called for the increased usage of non-planar transistors such as tri-gate transistors, FinFETs, TFETS, omega-FETs, and double-gate transistors. Among the non-planar transistors, Gate-All-Around transistors provide a better control of the channel by having a gate structure surrounding the channel on four surfaces. However, maintaining mobility improvements while increasing short channel control is still a major challenge. Many different techniques have been attempted to improve controlling source to drain leakage, however, significant improvements are still needed.

BRIEF DESCRIPTION OF THE DRAWINGS

Embodiments of the present disclosure are illustrated by way of example, and not by way of limitation, in the figures of the accompanying drawings.

FIGS. 1-5 illustrate various operations in a method of fabricating internal spacers in non-planar semiconductor devices, in accordance with an embodiment of the present invention, where:

FIG. 1 illustrates a semiconductor structure having a nanowire stack disposed above a substrate.

FIG. 2 illustrates exposing the nanowires by removing a sacrificial gate structure and at least a portion of the interlayer material, in accordance with an embodiment of the present invention.

FIG. 3 illustrates formation of internal spacers between the channel region and the source/drain regions, in accordance with an embodiment of the present invention.

FIG. 4 illustrates formation of a functional gate structure surrounding the nanowires within the channel region, in accordance with an embodiment of the present invention.

FIGS. 6-15 illustrate various operations in a method of fabricating a silicon on insulator (SOI) fins in non-planar semiconductor devices, in accordance with an embodiment of the present invention, where:

FIG. 6 illustrates a bulk semiconductor substrate having fins etched therein, in accordance with an embodiment of the present invention.

FIG. 7 illustrates formation of a shallow trench isolation (STI) layer on top of the substrate, in accordance with an embodiment of the present invention.

FIG. 8 illustrates formation of a hardmask on exposed surfaces of the top portion of the fins, in accordance with an embodiment of the present invention.

FIG. 9 illustrates recessing the STI layer to expose and oxidize a sub-channel region of the fins, in accordance with an embodiment of the present invention.

FIG. 10 illustrates recessing the STI layer to expose and oxidize a first sub-channel region of the fins, in accordance with an embodiment of the present invention.

FIG. 11 illustrates recessing STI layer further to form a hardmask on the surfaces of a lower portion of the fins, in accordance with an embodiment of the present invention.

FIG. 12 illustrates recessing STI layer further to expose and oxidize a second sub-channel region of the fin, in accordance with an embodiment of the present invention.

FIG. 13 illustrates removing the hardmasks, in accordance with an embodiment of the present invention.

FIG. 15 illustrates a plan view of the semiconductor device of FIG. 14, in accordance with an embodiment of the present invention.

DETAILED DESCRIPTION

Embodiments of the present invention are directed to fabricating hardmasks and internal spacers in non-planer devices. In the following description, numerous details are set forth in order to provide a thorough understanding of the present invention. It will be apparent, however, to one skilled in the art, that the present invention may be practiced without these specific details. In other instances, well-known semiconductor processes and manufacturing techniques have not been described in detail to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The term "silicon nitride" and the term "SiN", as used herein, are meant to encompass all silicon nitride species including but not limited to disilicon trinitride ($Si_2N_3$), monosilicon mononitride (SiN), trisilicon tetranitride ($Si_3N_4$), and mixtures thereof.

Embodiments of the present invention relate to a method of selectively growing silicon nitride on the silicon surfaces in semiconductor devices. In an embodiment, combined surfaces of the device are exposed to nitrogen, wherein the nitrogen selectively consumes the silicon to form a silicon nitride layer at the surface of the silicon material. In an embodiment, a remote chamber is used to generate a plasma containing nitrogen radicals before subjecting the surfaces to the plasma.

In an embodiment of the invention, silicon nitride is grown on the silicon surfaces, where the channel region interfaces with the source and drain regions, to form internal spacers in a gate-all-around device. The silicon nitride internal spacers provide excellent electrical isolation of the gate structure from the source and drain regions. In an embodiment, the remains of silicon in the interface region of the nanowire device are selectively nitrified to form self-aligned silicon nitride internal spacers.

In an alternative embodiment of the invention, silicon nitride is grown on the top portion of the silicon fins to form a hardmask. The silicon nitride hardmask forms an effective barrier against oxidation of underlying epitaxial silicon. In an embodiment, the silicon nitride hardmask is used to form Silicon on Insulator (SOI) fin structures in the gate region. In an embodiment, the silicon nitride hardmask is formed by selectively nitriding the silicon surface of the top portion of the fins.

Figure 1:
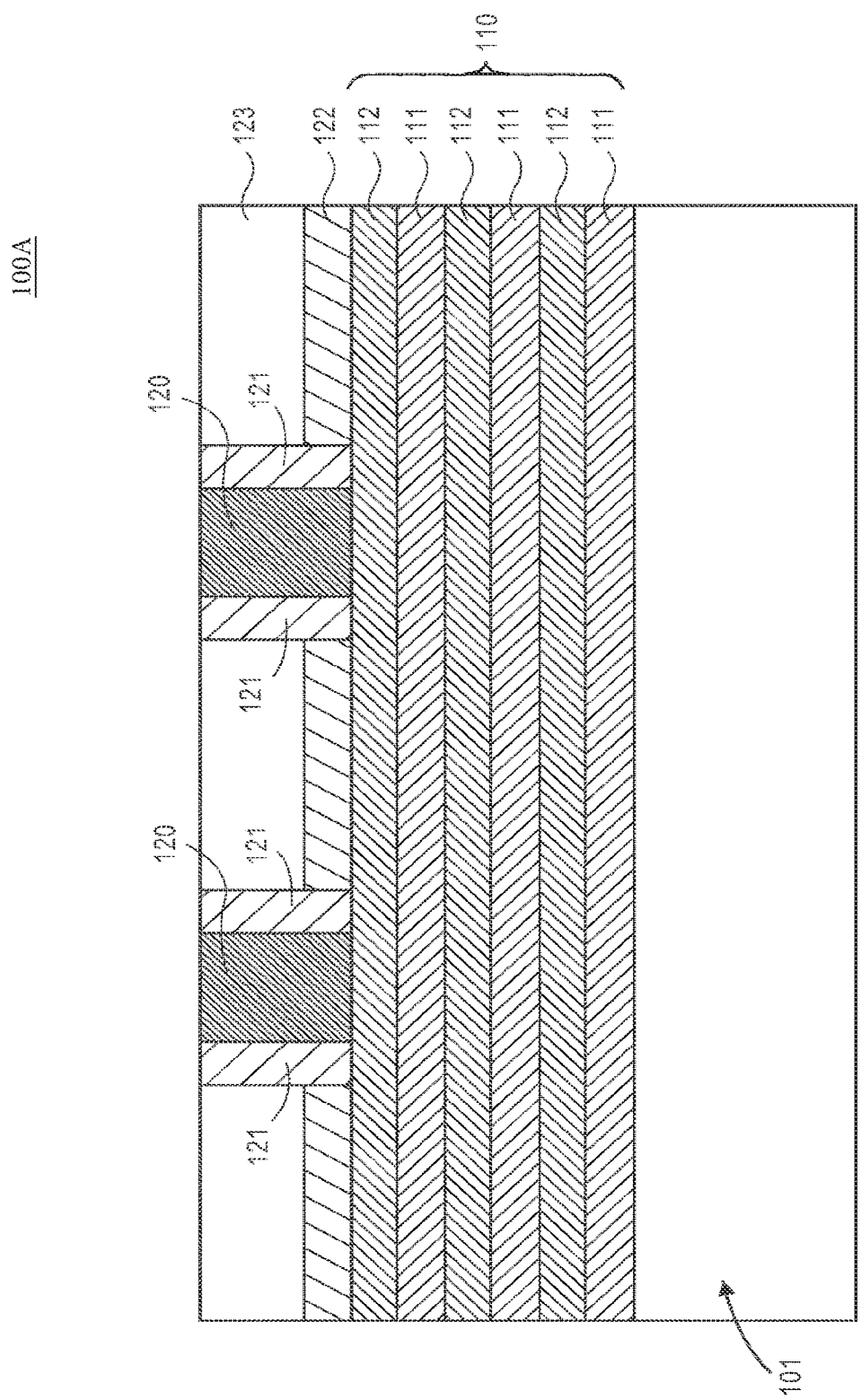

Referring to FIG. 1, structure 100A is provided having nanowire stack 110 disposed above substrate 101. Nanowire stack 110 includes nanowires 112 and interlayer material 111. Structure 100A further includes two gate structures 120 surrounded by a pair of external sidewall spacers 121 on both sides. In an embodiment, the top exposed surfaces of structure 100A are covered by inter-layer dielectric (ILD) layer 123.

Substrate 101 may be composed of any suitable material for semiconductor device fabrication. In one embodiment, the structure is formed using a bulk semiconductor substrate. Substrate 101 may include, but is not limited to, silicon, germanium, silicon-germanium, or a III-V compound semiconductor material. In another embodiment, the structure is formed using a silicon-on-insulator (SOI) substrate. An SOI substrate includes a lower bulk substrate, a middle insulator layer disposed on the lower bulk substrate, and a top monocrystalline layer. The middle insulator layer may include silicon dioxide, silicon nitride, or silicon oxynitride. The top single crystalline layer may be any suitable semiconductor material, such as those listed above for a bulk substrate.

Nanowire stack 110 may be formed by known methods, such as forming alternating layers of nanowire and sacrificial material over substrate 101, and then etching the layers to form a fin-type structure (nanowire stack 110), e.g. with a mask and plasma etch process. Alternatively, nanowire stack 110 may be formed within trenches in a shallow trench isolation (STI) layer. In an embodiment, interlayer material 111 may be any material that can be selectively etched with respect to nanowires 112. Nanowires 112 and interlayer material 111 may each be a material such as, but not limited to, silicon, germanium, SiGe, GaAs, InSb, GaP, GaSb, InAlAs, InGaAs, GaSbP, GaAsSb, and InP. In a specific embodiment, interlayer material 111 is silicon. In such an embodiment, nanowires 112 are either SiGe or Ge. In an embodiment, interlayer material 111 is formed to a thickness sufficient to create a desired amount of strain in nanowires 112.

The gate structures 120 may be functional or sacrificial. In the example embodiment illustrated in FIG. 1, gate structures 120 are sacrificial, wrapping around nanowire stack 110. Gate structure 120 may be any suitable material, such as polysilicon. In another embodiment, the gate structures are functional and each includes a gate dielectric layer and a gate electrode that wraps around the channel portions of nanowires 112.

The pair of external sidewall spacers 121 is formed on sidewalls of the gate structure 120 that are external to the nanowire stack 110, according to an embodiment of the invention. External sidewall spacers 121 may be formed using conventional methods of forming spacers known in the art. External sidewall spacers 121 may be any suitable dielectric material such as, but not limited to, silicon oxide, carbon-doped silicon oxide, silicon nitride, silicon oxynitride and combinations thereof. In an embodiment, external sidewall spacers 121 are from 20 to 100 Å thick.

ILD layer 123 may be deposited over the exposed surfaces of the structure using a conventional technique, such as CVD. In an embodiment, ILD layer 123 may be any dielectric material such as, but not limited to undoped silicon oxide, doped silicon oxide (e.g., BPSG, PSG), silicon nitride, and silicon oxynitride. After ILD layer 123 is deposited, any overburden may then be polished back using a conventional chemical mechanical planarization method to expose the top surface of gate structure 120 and the top surfaces of the pair of external side spacers 121, as shown in FIG. 1.

In an embodiment, topmost layer 122 is deposited between ILD layer 123 and nanowire stack 110. In an embodiment, topmost layer 122 is formed from interlayer material 112. Alternatively, topmost layer 122 is a hardmask. The hardmask may be composed of any suitable material for protecting underlying nanowires from etching and doping processes.

Figure 2:
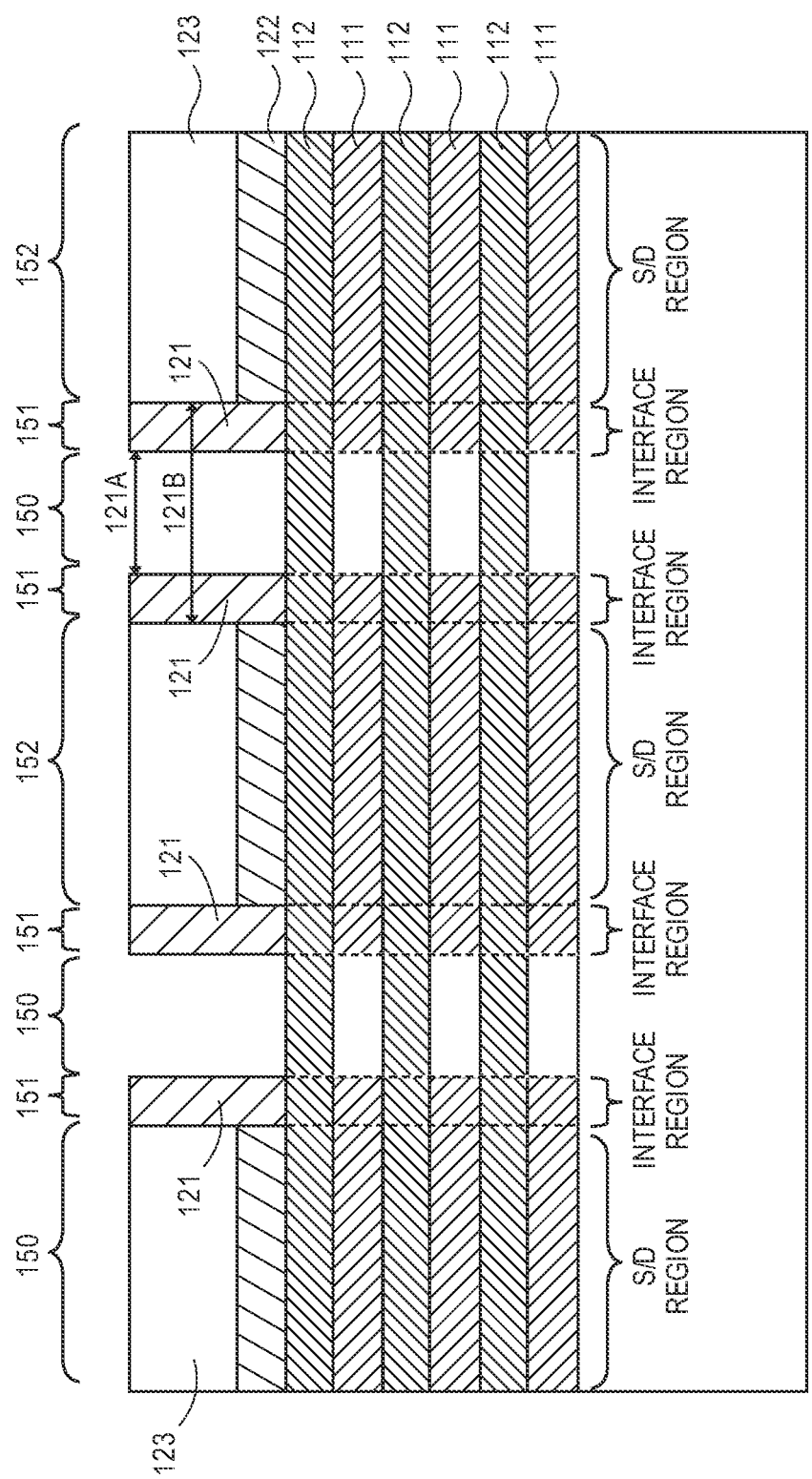

In FIG. 2, nanowires 112 are exposed by removing sacrificial gate structure 120 and at least a portion of interlayer material 111. In an embodiment, sacrificial gate structure 120 of FIG. 1 is first removed to expose the top portion of nanowire stack 110. Sacrificial gate structure 120 may be removed using a conventional etching method such as a dry etch or a wet etch. In a specific embodiment, sacrificial gate structure 120 is removed utilizing a wet etching process. The wet etching process may utilize tetramethylammonium hydroxide pentahydrate (TMAH) or a mixed solution of nitric acid and hydrofluoric acid to remove sacrificial gate structure 120.

Referring to FIG. 2, at least a portion of interlayer material 111 is removed to expose the full perimeter of each nanowire 112, according to an embodiment. The channel region is defined by the void between the adjacent nanowires 112 created by the removal of interlayer material 111. In an embodiment, the length of channel region 150 is equal to the distance between inner surfaces 121A of the pair of external sidewall spacers 121. In other embodiments, the interlayer material 111 underneath the pair of external sidewall spacers 121 may be removed to form a wider channel region 150. In an embodiment, channel region 150 may be wider than the distance between inner surfaces 121A of the pair of external sidewall spacers 121.

In an embodiment of the invention, a pair of source/drain regions 152 is defined on opposite sides of channel region 150. The pair of source/drain regions 152 are separated from channel region 150 by interface regions 151. The length of interface regions 151 may or may not be equal to the width of external sidewall spacers 121. In an embodiment, the long of interface regions 151 may be aligned with outer surface 121B and inner surface 121A of external sidewall spacers 121. In an alternative embodiment, interface regions 151 may be within inner surface 121A, outside outer surface 121B, or partially occupying any combination of these regions. In an embodiment, interface regions 151 are filled with the remains of interlayer material 111.

Interlayer material 111 may be removed using any known etchant that is selective to nanowires 112. In an embodiment, interlayer material 111 is removed by a timed wet etch process, timed so as to undercut the external sidewall spacers 121. The selectivity of the etchant may be greater than 50:1 for interlayer material over nanowire material. In an embodiment where nanowires 112 are silicon germanium and interlayer material 111 is silicon, interlayer material 111 is selectively removed using a wet etchant such as, but not limited to mixtures of nitric acid and hydrofluoric acid. In an embodiment where nanowires 112 are germanium and interlayer material 111 is silicon, interlayer material 111 is selectively removed using a wet etchant such as, but not limited to, aqueous solutions of tetramethylammonium hydroxide (TMAH). In another embodiment, interlayer material 111 is removed by a combination of wet and dry etch processes.

Figure 3:
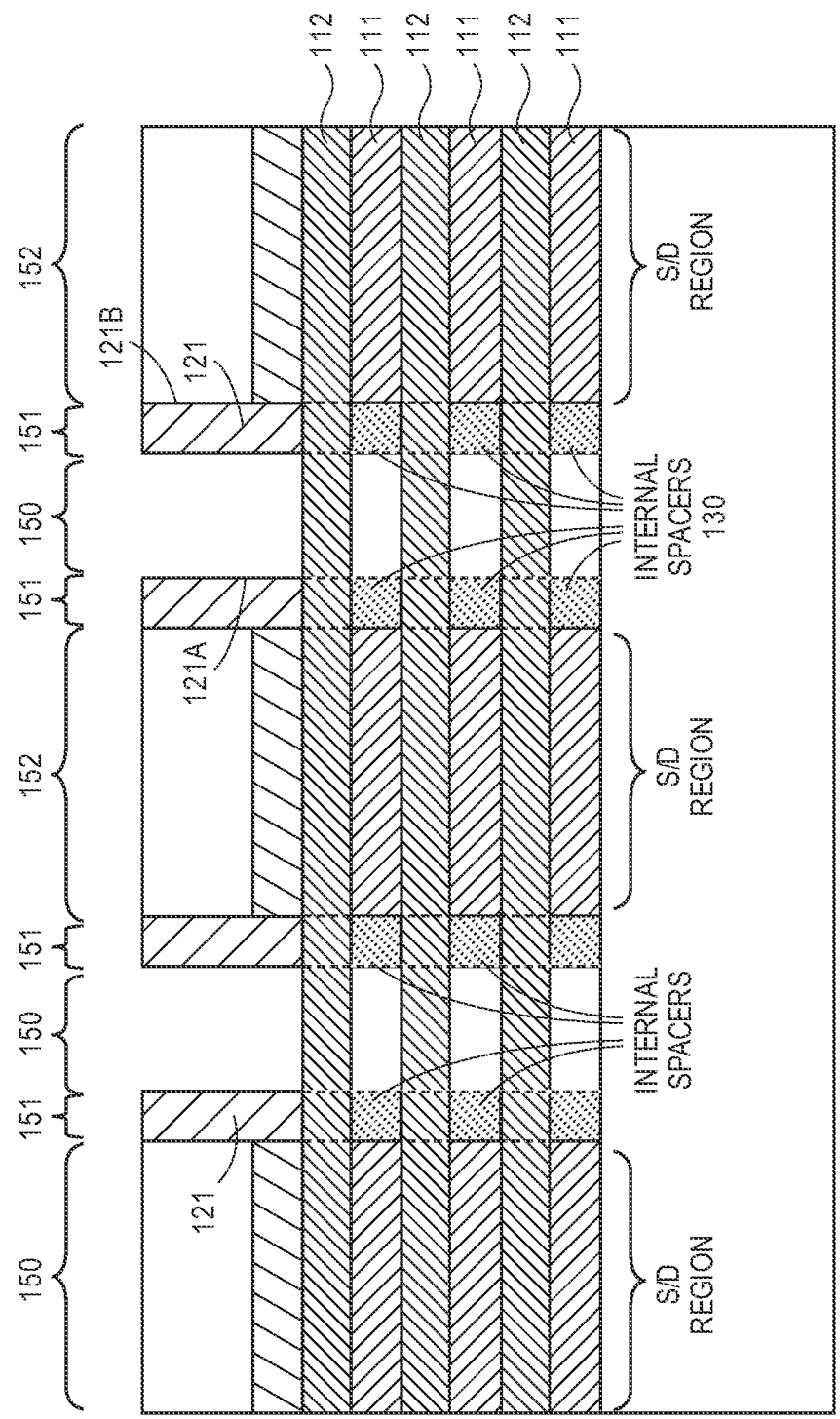

In FIG. 3, internal spacers 130 are formed in interface regions 151 according to an embodiment of the invention. Internal spacers 130 may be formed by nitriding the remaining interlayer material in interface regions 151. Internal spacers 130 may be formed of SiN material. In one embodiment, silicon nitride may be grown at a temperature above room temperature by any appropriate methods such as dry, wet, or plasma nitridation or by any combination of these methods. Internal spacers 130 may be of the same or different thickness as external sidewall spacers 121. In an embodiment, internal spacers 130 may have a thickness of 0.5-3.0 nm. The internal spacers provide additional insulation between the gate structure and source/drain regions, which reduces overlap capacitance, risk of shorting, and current leakage.

In an embodiment of the invention, silicon nitride internal spacers 130 are formed by nitridation of the remaining silicon in the interface region 151. The surfaces of the opening that is formed by the removal of the gate structure and interlayer material are exposed to plasma generated nitrogen. For example, an RF plasma may be employed to dissociate molecular nitrogen into atomic and/or ionic nitrogen. The atomic and/or ionic nitrogen may then be incorporated into the silicon surface. In an embodiment, nitrogen plasma selectively consumes the silicon in interface regions 151 to form self-aligned silicon nitride internal spacers 130. In an embodiment, SiN formation is selective to silicon surfaces with respect to other surfaces that are concomitantly exposed to remote nitrogen plasma. Other surfaces may include dielectric materials, or more specifically, $SiO_7$, SiGe (such as $Si_{70}Ge_{30}$), or Ge. In an embodiment, interface regions 151 formed a diffuse boundary between source/drain regions and channel region.

The nitrogen plasma generation can be accomplished in-situ or utilizing a remote plasma chamber. In an in-situ process, nitrogen plasma radicals are generated in the same chamber in which the substrate is treated. An example of a suitable plasma chamber includes a capacitively-coupled PECVD or a high density plasma HDP chamber.

In an embodiment, the nitrogen plasma is created by a remote plasma source (RPS). In such an embodiment, nitrogen plasma is generated in a chamber that is partitioned or separated from the chamber in which the substrate to be treated is located. In an embodiment, utilizing a remote plasma chamber is preferred because the process of energizing nitrogen may damage the device structure. The remote plasma chamber may generate nitrogen plasma using known techniques such as conventional processes using RF plasmas (for example, capacitively coupled RE plasmas or inductively coupled RE plasmas). Alternatively, nitrogen plasma is generated with microwaves. The RPS may generate a number of charged (ions) and neutral (radical) nitrogen species. In an embodiment, the nitrogen radicals are preferred because higher-energy species such as ions may unacceptably damage exposed surfaces by the amount of energy they dissipate. As such, nitrogen radicals are transferred through a conjunctive tube to the substrate processing chamber. The process may be at a Rapid. Thermal Processing stage, e.g. Rapid thermal anneal (RTA) chamber. As such, the highly reactive $N_2$ radicals react with free silicon, silicon having dangling bonds, on the surface.

In an embodiment of the invention, surfaces within the opening of channel region 150 are exposed to the plasma nitrogen at an elevated temperature. In an embodiment, the substrate temperature may be 500°-1100° C. The plasma nitrogen selectively consumes the remaining silicon in interface regions 151 to grow silicon nitride. In an embodiment, the disclosed process provides a self-limiting growth during nitridation of the silicon. In an embodiment, the exposure time may vary from 15-200 seconds. In an embodiment, the exposure time may depend on different variables such as temperature and pressure.

In an embodiment of the invention, exposing the remaining silicon in interface regions 151 to nitrogen plasma forms a diffuse boundary between the source/drain regions and the channel region of the device. In an embodiment, nitrogen diffuses laterally into silicon surfaces and as such a non-linear concentration gradient exists within the diffuse interface regions 151. The relative concentration of nitrogen in silicon tends to be higher near the channel region and decreases progressively toward the source/drain regions. The relative concentration of nitrogen in silicon tends to be at the lowest near the source/drain regions. The diffuse interface regions 151 serve to form securely bonded and self-aligned internal spacers 130.

In an embodiment of the invention, internal spacers 130 are self-aligned with respect to the nanowires above and below them. In an embodiment, the top surface of internal spacer 130 is coplanar with the bottom surface of nanowire 112 that is above the internal spacer 130. In an embodiment, the bottom surface of internal spacer 130 is coplanar with the top surface of nanowire 112 that is below the internal spacer 130. In an embodiment, as shown in FIG. 3, internal spacers 130 are aligned with inner and outer surfaces 121A and 121B of external sidewall spacer 121. In an embodiment, internal spacers 130 may be of the same or different thickness as external sidewall spacers 121. In an embodiment, internal spacers may be disposed within or outside the distance between inner surfaces 121A of the pair of external sidewall spacers 121.

Figure 4:
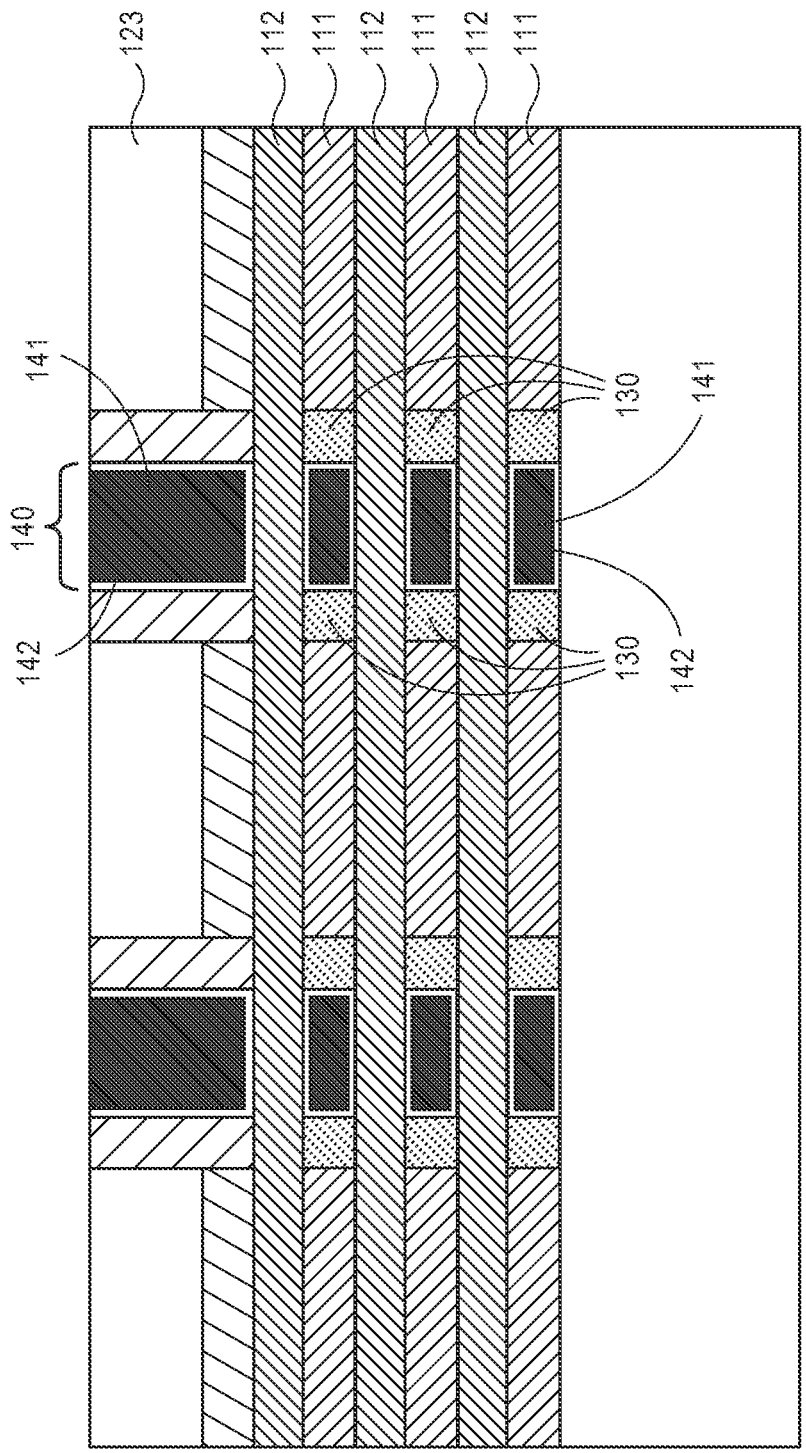

Referring to FIG. 4, a functional gate structure 140 may be formed, wrapping around nanowires 112 in channel region 150. Gate structure 140 may include gate dielectric layer 142 and gate electrode 141. In an embodiment, gate dielectric layer 142 is conformally deposited over the exposed surfaces of nanowires 112. In an embodiment, gate dielectric layer 142 may also be formed along the exposed sidewalls of internal spacers 130 and over the exposed portion of substrate 101. Gate dielectric layer 142 may be formed from any well-known gate dielectric material such as, but not limited to silicon oxide, silicon nitride, silicon oxynitride, aluminum oxide, aluminum silicate, hafnium oxide, hafnium silicate, zirconium oxide, zirconium silicate, or a rare earth oxide based material. In an embodiment, gate dielectric layer 142 is formed using a highly conformal deposition method such as low pressure chemical vapor deposition (LPCVD), atomic layer deposition (ALD), or spin-on-dielectric process.

Referring to FIG. 4, according to one embodiment of the invention, gate electrode material may be deposited over gate dielectric layer 142 to form gate electrode 141. Gate electrode 141 fills the space left from the removal of the portion of interlayer material 111 in channel region 150. According to an embodiment, gate electrode 141 is deposited using a conformal deposition process such as atomic layer deposition (ALD) to ensure that gate electrode 141 is formed on gate dielectric layer 142 and around nanowire 112. The blanket gate electrode material may then be chemically and mechanically planarized until the top surface of gate electrode 141 is at the same height as ILD layer 123 as illustrated in FIG. 4.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium and other rare earth metals, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4:2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include side wall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

The resultant transistor device formed using the method described is a non-planar gate all-around device with a nanowire channel, in accordance with an embodiment of the present invention.

Figure 5A:
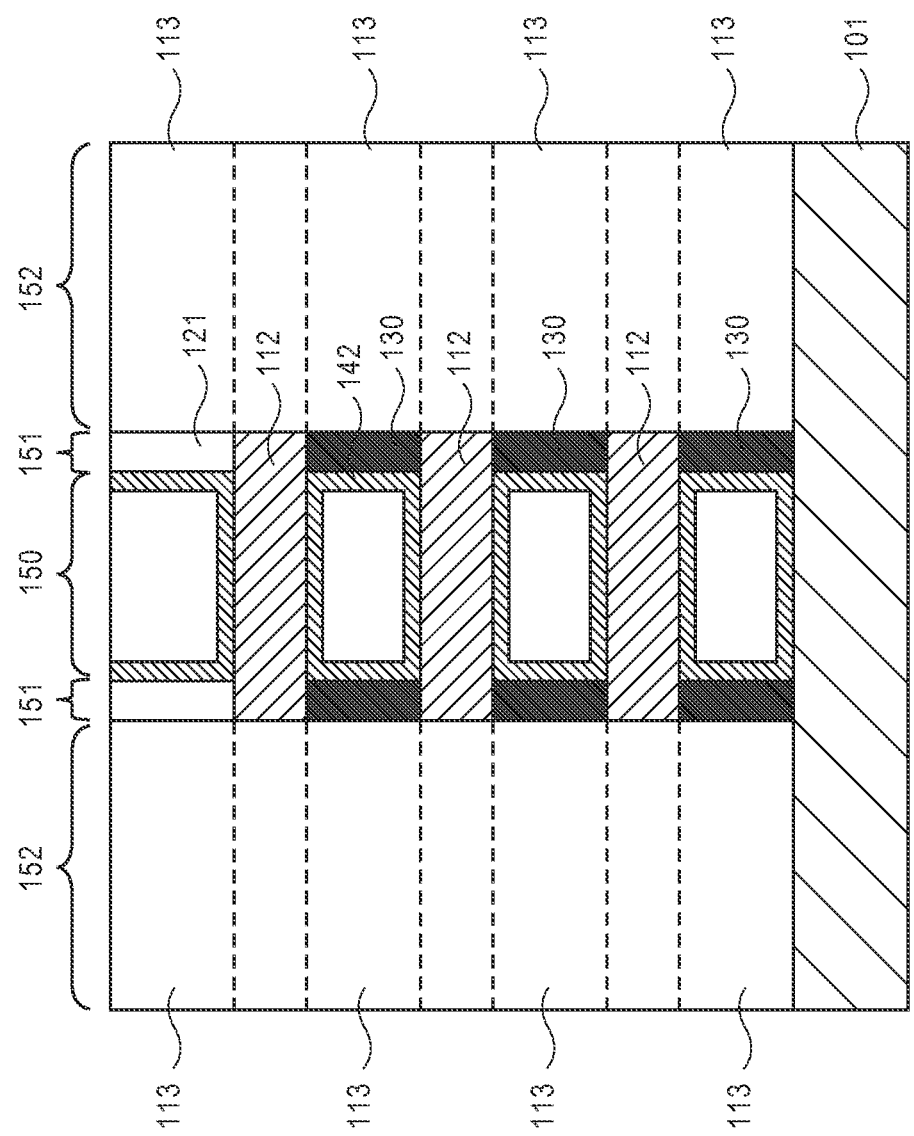
FIG. 5A illustrates formation of source/drain portions that wraps around the nanowires in source/drain regions, in accordance with an embodiment of the present invention.
Figure 5B:
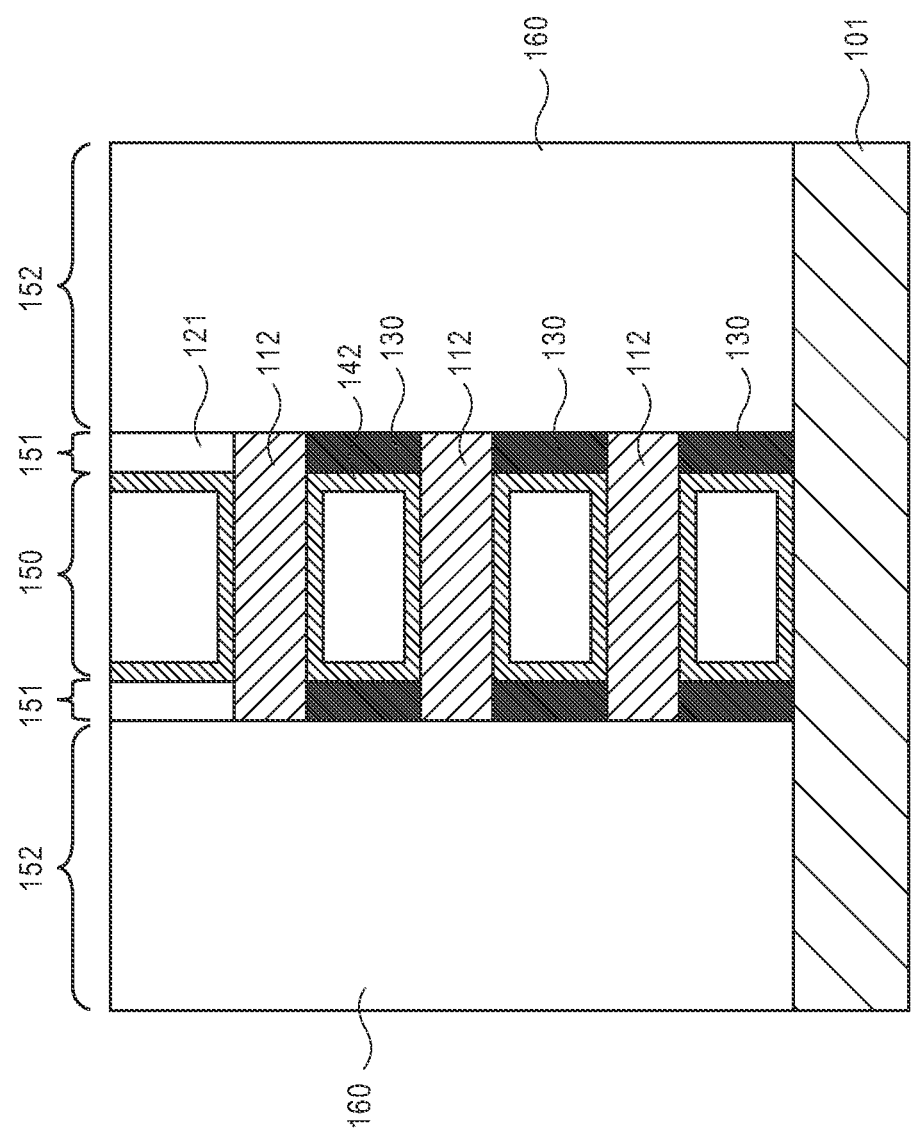
FIG. 5B illustrates formation of homogeneous source/drain portions that are in electrical contact with the channel portions of each nanowire, in accordance with an embodiment of the present invention.

Additional processing steps may then be performed to form a functioning device, such as forming source/drain contacts as shown in FIGS. 5A and 5B. The source/drain contacts may be formed in trenches etched to expose the full perimeter of the source/drain portions of nanowires 112. In an embodiment, the source/drain contacts are formed from a metal species that wraps around the source/drain portions of the nanowires. Referring to FIG. 5A, source/drain contacts 113 wraps around the portion of nanowires 112 that are in source/drain regions 152. Internal spacers 130 reduce the capacitance between gate electrode 141 and source/drain contacts 113. Source/drain contacts 113 may be a semiconductive or metal material.

In another embodiment, homogeneous source/drain regions are formed as shown in FIG. 5B. Referring to FIG. 5B, homogeneous source/drain portions 160 are in electrical contact with the channel portions of each nanowire 112. In an embodiment, homogeneous source and drain portions 160 may be doped or undoped semiconductor material. In another specific embodiment, homogeneous source/drain portions 160 are metal species. In an embodiment, a portion of nanowires 112 remains in interface region 151, such as between internal spacers 130, as shown in FIG. 5B.

In a completed device, internal spacers 130 isolate the functional gate structure 140 from the source/drain regions 152. In an embodiment, internal spacers 130 reduce overlap capacitance between the portions of gate electrode 141 internal to the nanowire stack and any adjacent conductive or semiconductive material within source/drain regions 152.

Figure 5C:
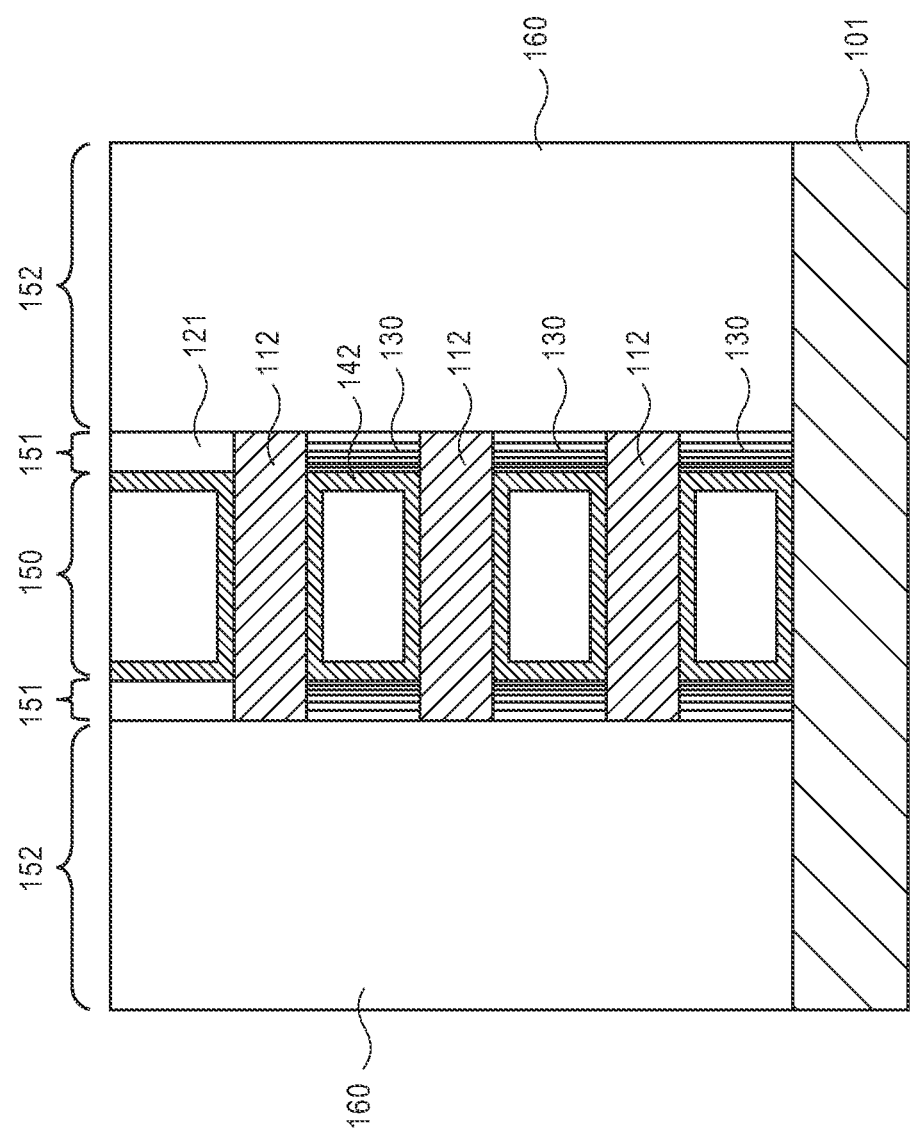
FIG. 5C illustrates a diffuse interface region between the source/drain regions and channel region, in accordance with an embodiment of the present invention.

Referring to FIG. 5C, internal spacers 130 may exhibit a non-linear concentration of nitrogen. In an embodiment, nitrogen diffuses laterally into silicon surfaces and as such a non-linear concentration gradient exists within the diffuse interface regions 151. The relative concentration of nitrogen in silicon tends to be higher near channel region 150. The nitrogen to silicon ratio decreases progressively toward source/drain regions 152. The relative concentration of nitrogen in silicon tends to be at the lowest near source/drain regions 152.

In an alternative embodiment of the invention, a silicon nitride layer is grown in a top portion of silicon fins to form a hardmask. The SiN hardmask forms an effective barrier against oxidation of underlying epitaxial silicon. In an embodiment, the SiN hardmask is used to form Silicon on Insulator (SOI) fin structures.

Figure 6:
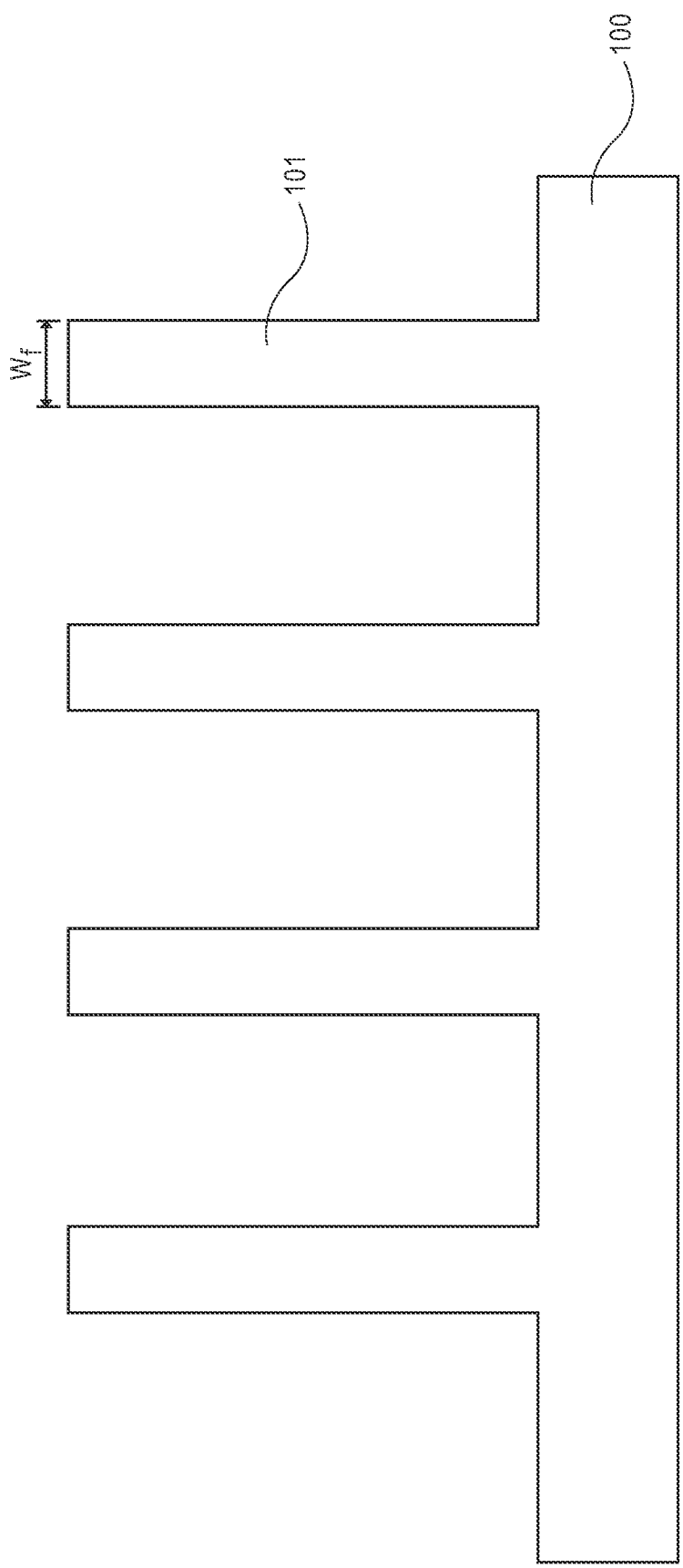

Referring to FIG. 6, substrate 100 with a plurality of fins 101 is illustrated. The number of fins 101 formed on substrate 100 can be adjusted to an appropriate number, as it is understood to those skilled in the art. In an embodiment, fins 101 are formed using an etching process. A patterning etch mask is placed on substrate 100. Thereafter, substrate 100 is etched and the portions of the substrate protected by the mask form fins 101. The etch masks are then removed.

In an embodiment, substrate 100 may be composed of any suitable material for semiconductor device fabrication. In an embodiment, substrate 100 may be a crystalline substrate formed using a bulk silicon. In an embodiment, fins 101 are formed from the same material as substrate 100. In other embodiments, semiconductor substrate 100 may be formed from different material as fins 101. In an embodiment, fins 101 are made from silicon. In an embodiment, substrate 100 may be formed using alternative materials. Such materials may include, but are not limited to, germanium, indium antimonide, lead telluride, indium arsenide, indium phosphide, gallium arsenide, indium gallium arsenide, gallium antimonide, or other combinations of group III-V or group IV materials. Although a few examples of materials from which substrate 100 may be formed are described here, any material that may serve as a foundation upon which a semiconductor device may be built falls within the spirit and scope of the present invention.

In an embodiment, fins 101 are high aspect ratio fins. In an embodiment, the high aspect ratio fins may have a height to width ratio that is 2:1, or greater. An additional embodiment may include fins 101 that have a height to width ratio that is 10:1, or greater. By way of example the width $W_F$ of the fins 101 may be between 8-20 nm.

Figure 7:
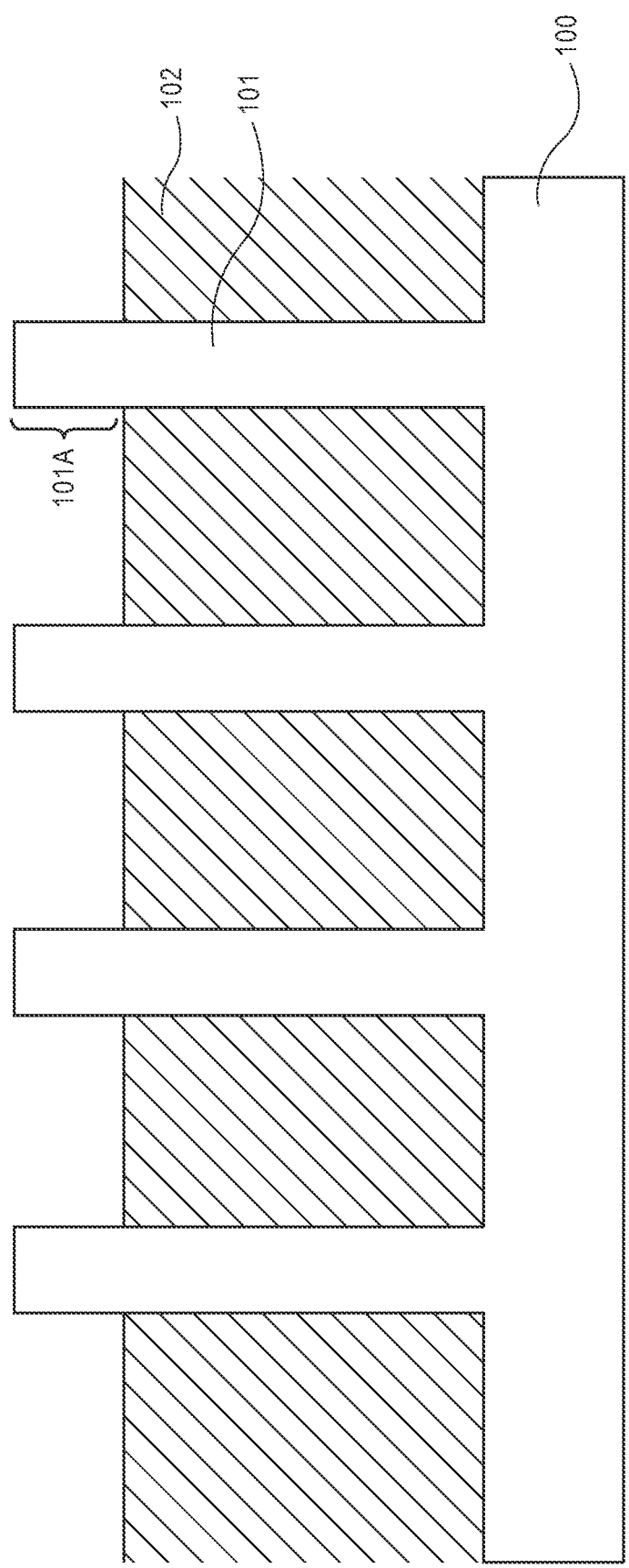

Referring to FIG. 7, shallow trench isolation (STI) layer 102 may be formed over the top surface of substrate 100. In an embodiment, top portion 101A of fins 101 remain above the top surface of STI layer 102. In an embodiment, any appropriate deposition process such as a chemical vapor deposition (CVD) process can be used to deposit STI layer 102 over substrate 100. STI layer 102 may be deposited to a height that is greater than the top surface of fins 101. Then, as shown in FIG. 7, STI layer 102 is recessed to expose top portion 101A of fins 101. In an embodiment, the exposed top portion 101A of fins 101 will eventually become an isolated semiconductor body for use in a tri-gate or FinFET device. Accordingly, the degree or depth to which the STI material is recessed and the fin structure is exposed corresponds to a desired thickness or height of the isolated semiconductor body being formed. In other embodiment, multiple channel regions are formed within the fin structure.

In an embodiment, STI layer 102 may be formed from any appropriate insulating material. For example, STI layer 102 may be an oxide, such as a silicon oxide. According to an additional embodiment, STI layer 102 may include a plurality of dielectric materials. For example, a first dielectric material may be a conformal material and a second dielectric material may be a fill material. Conventional processes may be used to recess or etch the STI material, including but not limited to wet etching processes using hydrogen fluoride (HF) or dry etching processes using $CHF_3$, $CH_3F$, or $CF_4$. In further implementations, other wet or dry etching processes may be used.

Figure 8:
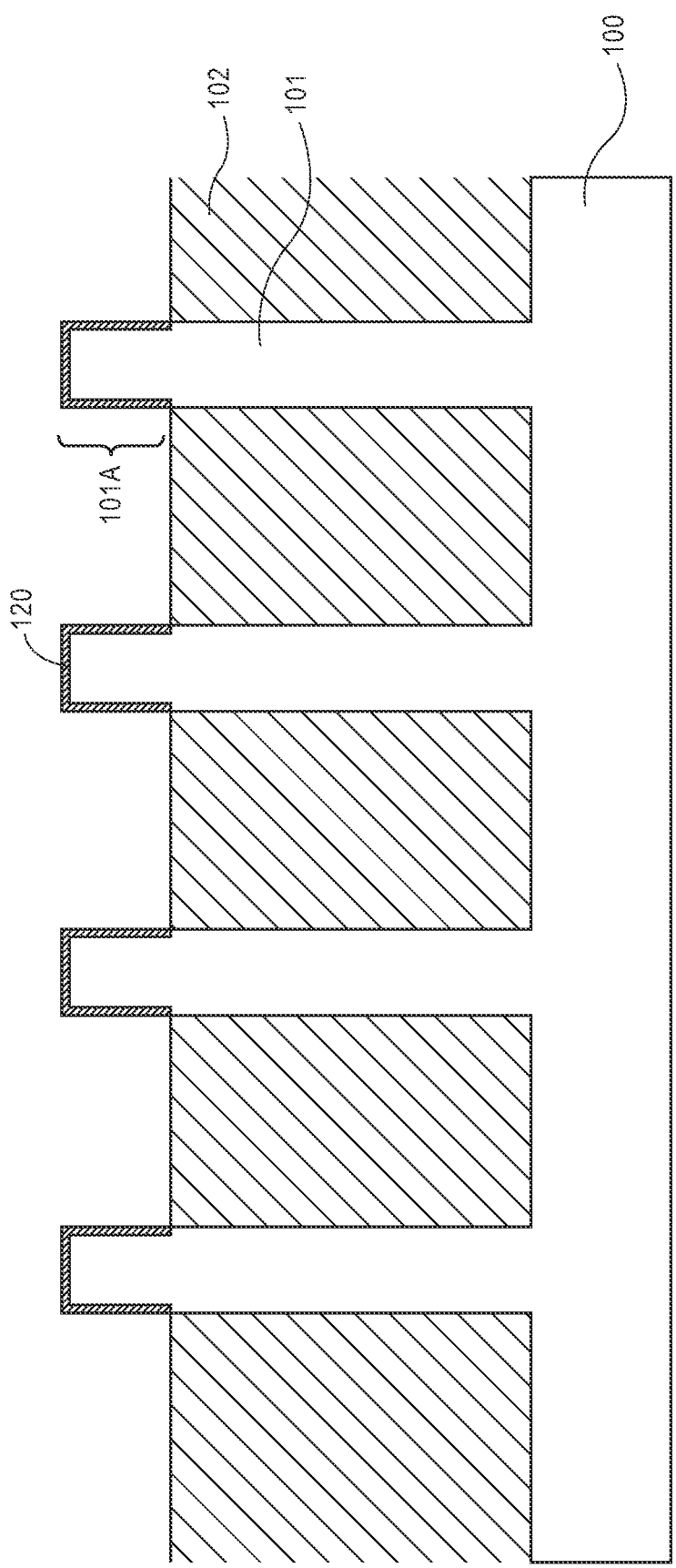

Referring to FIG. 8, hardmask 120 is formed on exposed surfaces of top portion 101A of fins 101. In an embodiment, hardmask 120 may be formed by nitriding the exposed surfaces of top portion 101A. In an embodiment, hardmask 120 forms a protective cap made from silicon nitride material. Top portion 101A of fins 101 are now contained within a nitride cap and protected from oxidation. Silicon nitride may be grown on the exposed surfaces at a temperature above room temperature by any appropriate methods such as dry, wet, or plasma nitridation or by any combination of these methods. Alternatively, hardmask 120 may be deposited using conventional methods such as CVD, PVD, or ALD. In an embodiment, growing rather than depositing silicon nitride is preferred because of the better protection it provides against oxidation.

In an embodiment of the invention, silicon nitride hardmask 120 is formed by nitridation of the exposed silicon surfaces of top portion 101A of fins 101. The silicon surfaces are exposed to plasma generated nitrogen. For example, RF plasma may be employed to dissociate molecular nitrogen into atomic and/or ionic nitrogen. The atomic and/or ionic nitrogen may then be incorporated into the silicon surface. In an embodiment, nitrogen plasma selectively consumes the exposed silicon surfaces to form the nitride cap surrounding top portion 101A of fins 101. In an embodiment, silicon nitride formation is selective to silicon surfaces with respect to other surfaces that are concomitantly exposed to nitrogen plasma. Other surfaces may include dielectric material, or more specifically, $SiO_7$, SiGe (such as $Si_{70}Ge_{30}$), or Ge.

The nitrogen plasma generation can be accomplished in-situ or utilizing a remote plasma chamber. In an in-situ process, nitrogen plasma radicals are generated in the same chamber in which the substrate having silicon fins to be treated is located. An example of a suitable plasma chamber includes a capacitively-coupled PECVD or a high density plasma HDP chamber.

In an embodiment, the nitrogen plasma is created by a remote plasma source (RPS). In such an embodiment, the nitrogen plasma is generated in a chamber that is partitioned or separated from the chamber in which the substrate having exposed silicon fin to be treated is located. In an embodiment, utilizing a remote plasma chamber is preferred because the process of energizing nitrogen may damage the device. The remote plasma chamber may generate nitrogen plasma using known techniques such as conventional processes using RF plasmas (for example, capacitively coupled RE plasmas or inductively coupled RF plasmas). Alternatively, nitrogen plasma is generated with microwaves. The RPS may generate a number of charged (ions) and neutral (radical) nitrogen species. In an embodiment, the nitrogen radicals are preferred because higher-energy species such as ions may unacceptably damage exposed surfaces by the amount of energy they dissipate. As such, nitrogen radicals are transferred through a conjunctive tube to substrate processing chamber. As such, the highly reactive N$_2$ radicals react with free silicon, i.e., silicon having dangling bonds, on the surface.

In an embodiment of the invention, surfaces of top portion 101A of fins 101 are exposed to the remote plasma nitrogen at an elevated temperature. In an embodiment, the substrate temperature may be 500°-1100° C. The plasma nitrogen selectively consumes the exposed silicon surfaces of fins 101 to grow silicon nitride. In an embodiment, the disclosed process provides a self-limiting growth during nitridation of the silicon. In an embodiment, the exposure time may vary from 15-200 seconds. In an embodiment, the exposure time may depend on different variables such as temperature and pressure. In an embodiment, silicon nitride formation is selective to silicon surfaces with respect to other surfaces that are concomitantly exposed to nitrogen plasma.

In an embodiment, the nitride caps on top portion 101A of fins 101 have sufficient thickness to protect the underlying silicon fin from oxidation. In an embodiment, the thickness of hardmask 120 may vary between 0.5 to 3.0 nm. In an embodiment, because plasma nitrogen consumes the exposed surfaces of the fin structure, the thickness of top portion 101A of fins 101 is less than the rest of the fin structure.

Figure 9:
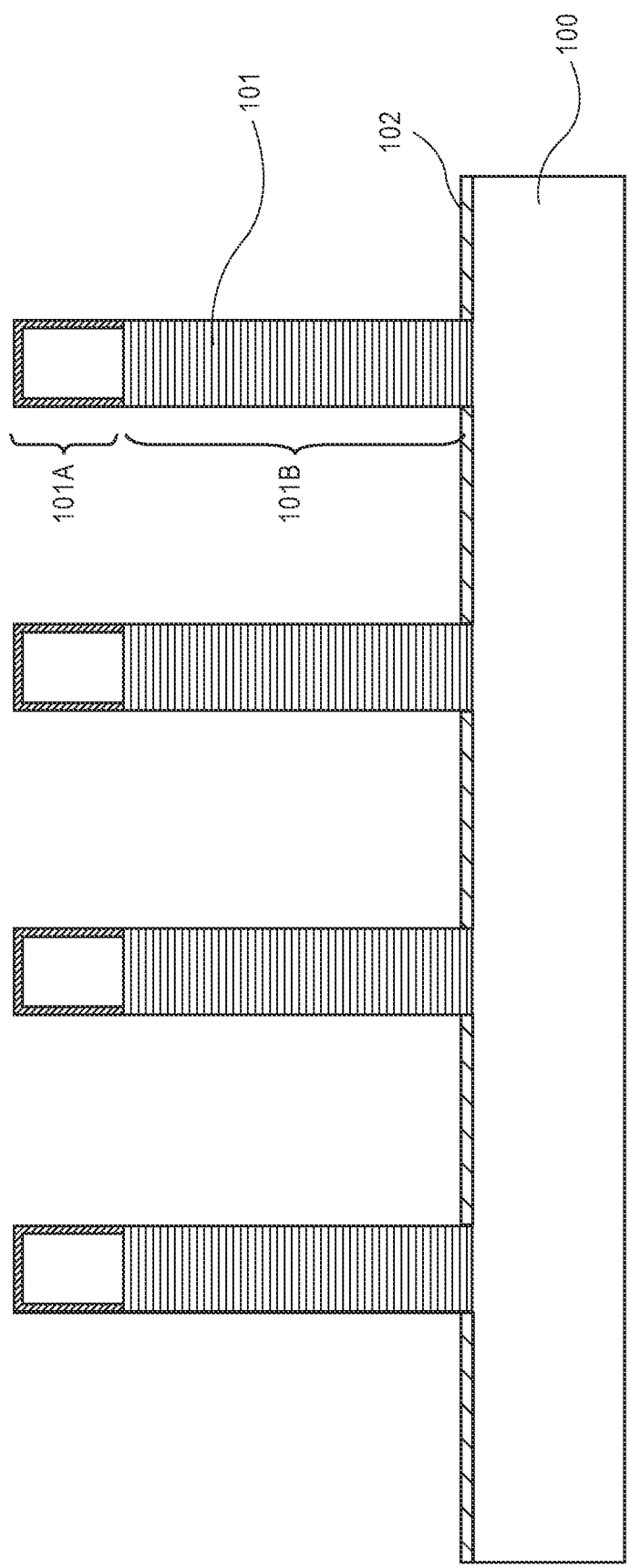
Figure 10:
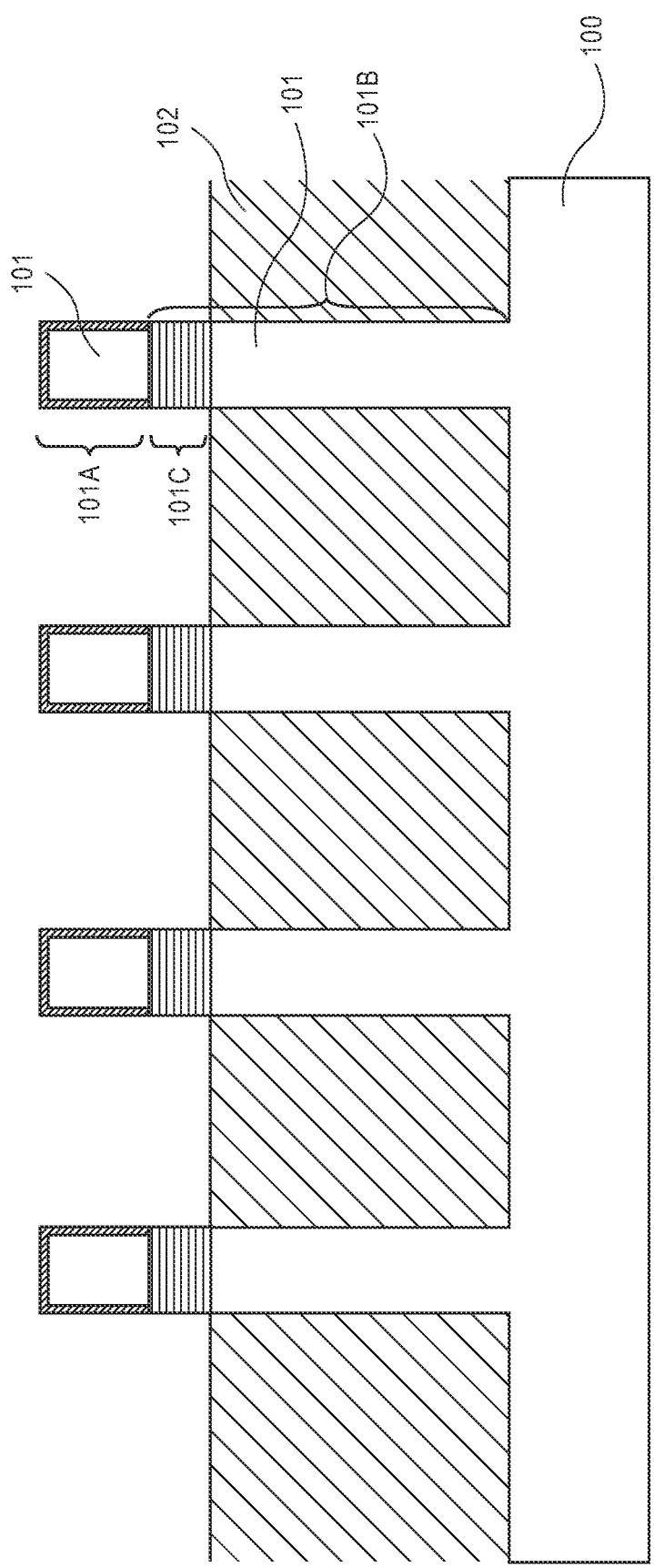

Referring to FIG. 9, STI layer 102 is recessed to expose at least a portion of sub-channel region of fins 101. In an embodiment, the entire sub-channel region 101B of fins 101 are exposed. Such an embodiment may be used to form a single active channel region within the fin structure. In an embodiment, STI layer 102 is entirely removed to expose sub-channel region 101B as well as the top surface of substrate 100 between fins 101. In an alternative embodiment, as shown in FIG. 10, STI layer 102 is recessed to a height such that only a portion (101C) of sub-channel region 101B is exposed. Such an embodiment may facilitate creation of multi-channel layer within fins 101, as explained in details below.

Referring again to FIG. 9, STI layer 102 may be recessed using conventional processes to recess or etch the STI material. Examples of recessing methods may include, but are not limited to, wet etching processes using hydrogen fluoride (HF) or dry etching processes using CHF$_3$, CH$_3$F, or CF$_4$. In further implementations, other wet or dry etching processes may be used.

Next, exposed sub-channel region 101B of fins 101 is oxidized. Sub-channel region 101B is the portion of the fin that is just below and not contained within hardmask 120. Sub-channel region 101B is below the bottom edge of the nitride cap and above the top surface of the remaining STI layer 102. In an embodiment where the entire STI layer 102 is removed, oxidation process may also oxidize at least the top surface of substrate 100 (not shown). In an embodiment of the invention, a thermal oxidation process is carried out to oxidize sub-channel region 101B. In an embodiment, the unprotected silicon of sub-channel region 101*b* is converted into silicon oxide material by the oxidation process.

The portion of the fin structure protected by hardmask 120 is now isolated from the substrate by the silicon oxide in the sub-channel region. In an embodiment, top portion 101A of fins 101 protected by hardmask 120 eventually forms the active channel region of the FinFET or tri-gate device. In an embodiment, the channel-width of the device is approximately twice the vertical height of the top portion 101A of fins 101 plus the width of the top surface of the fin within the hardmask 120.

In an embodiment of the invention, the thermal oxidation process may be implemented by annealing the substrate at a temperature between 900° to 1100° C. for time duration of 0.5 to 3 hours. The thermal oxidation may take place in an atmosphere that contains one or more of O$_2$, H$_2$, H$_2$O, steam, and HCl.

FIG. 9 illustrates formation of a single active channel region on the top portion of the fin structure. It is appreciated that multiple active channel regions may be formed within the fin structure by repeating the process explained above with respect to FIG. 9. FIGS. 10-13 illustrate the process of forming multiple active channel regions within the fin structure.

Referring to FIG. 10, in an embodiment, multi-channel regions are formed within fins 101. In an embodiment, STI layer 102 is recessed to a height such that only first sub-channel region 101C is exposed. First sub-channel region 101C is the part of fin 101 that is below the bottom edge of hardmask 120 and above the top surface of the remaining STI layer 102. The process of recessing STI layer 102 is explained in details with respect to FIG. 9 above and hence is not discussed again to avoid repetition.

In an embodiment of the invention, the exposed first sub-channel region 101C of fins 101 is oxidized. The process of oxidizing the sub-channel region is explained in details with respect to FIG. 9 above and hence is not discussed again to avoid repetition. The oxidation of first sub-channel region 101C isolates top portion 101A from the rest of fin 101. In an embodiment, top portion 101A of fin 101 is the only channel region of fin 101. In other embodiments, top portion 101A of fin 101 is one of the multi-channel regions of fin 101.

Figure 11:
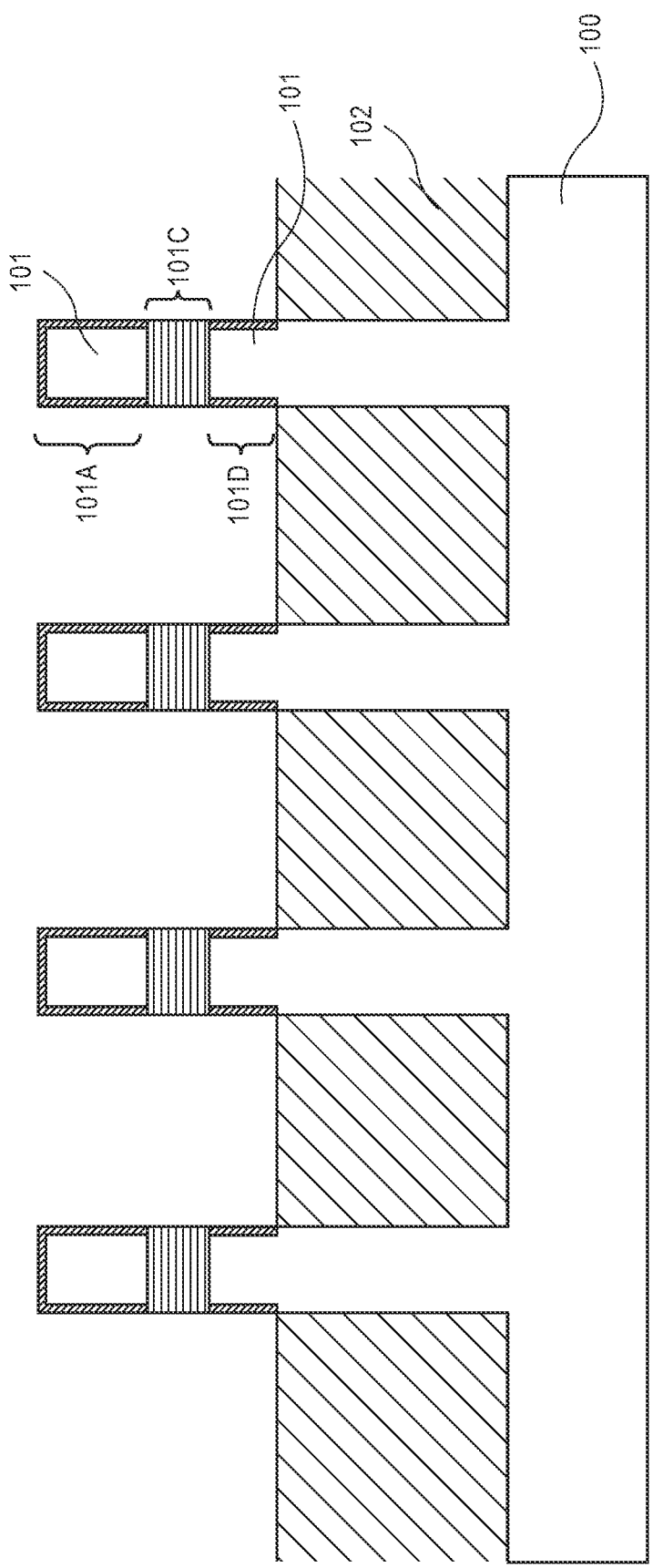

Referring to FIG. 11, STI layer 102 is recessed to expose lower portion 101D of fin 101. Lower portion 101D is the part of fin 101 that is below the bottom edge of first sub-channel region 101C and above the top surface of the remaining STI layer 102. In an embodiment, lower portion 101D of fin 101 will eventually form the second active channel region of fin 101. The process of recessing ILD layer 102 is explained in details with respect to FIG. 9 above and hence is not discussed again to avoid repetition.

Next, a hardmask is formed cm the exposed surfaces of lower portion 101D of fin 101. In an embodiment, the hardmask may be formed by nitiriding the exposed surfaces of lower portion 101D. In an embodiment, the hardmask may be formed of silicon nitride material. In an embodiment, silicon nitride may be grown on the exposed surfaces at a temperature above room temperature by any appropriate methods such as dry, wet, or plasma nitridation or by any combination of these methods. Alternatively, hardmask may be deposited using conventional methods such as CVD, PVD, or ALD. In an embodiment, growing rather than depositing silicon nitride is preferred because of the better protection it provides against oxidation.

In an embodiment of the invention, silicon surfaces of lower portion 101D is nitrided using plasma generated nitrogen. In an embodiment, nitrogen plasma selectively consumes the exposed silicon surfaces of lower portion 101D, as oppose to other surfaces such as first sub-channel region 101C, to form a nitride hardmask surrounding lower portion 101D of fins 101. In an embodiment, the thickness of nitrided surface in lower portion 101D may vary between 0.5 to 3.0 nm. The nitrogen plasma generation can be accomplished in-situ or utilizing a remote plasma chamber. The process of nitirding the silicon surfaces according to an embodiment is explained in details with respect to formation of hardmask 120 in FIG. 8 above and hence is not discussed again to avoid repetition.

Figure 12:
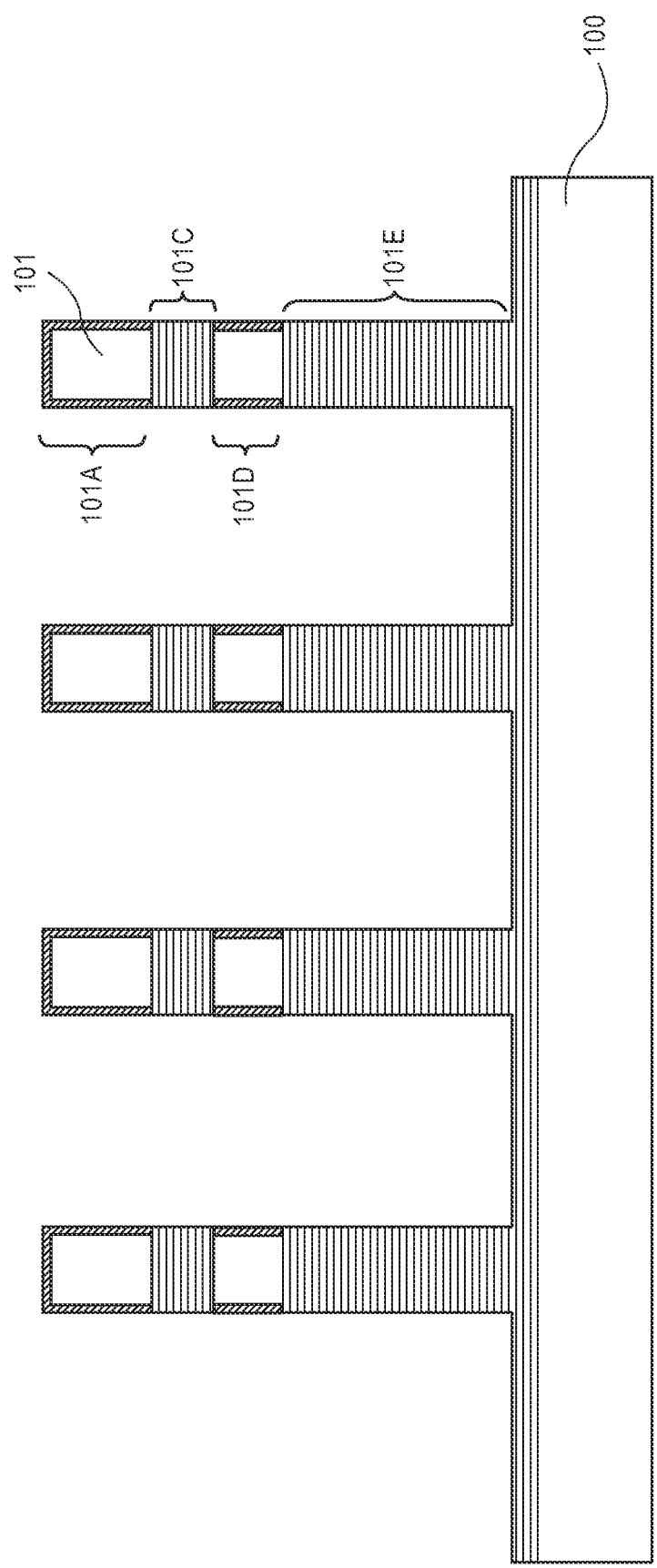

Referring to FIG. 12, STI layer 102 is recessed to expose second sub-channel region 101E. Second sub-channel region 101E is the part of fin 101 that is below the bottom edge of the hardmask in lower portion 101D and above the top surface of the remaining STI layer. In an embodiment, STI layer 102 may be recessed to a height to allow formation of additional channel layers below second sub-channel region 101E. In an embodiment, as shown in FIG. 12, STI layer 102 is entirely removed to expose top surface of substrate 100 between fins 101. In such an embodiment, second sub-channel region 101E is the part of fin 101 that is below the bottom edge of the hardmask in lower portion 101D and above the top surface of substrate 100. In an embodiment, the entire STI layer 102 is not removed so that an additional strain is provided to channel regions in the fin structure. On the other hand, removing STI layer 102 may facilitate oxidizing the top surface of substrate 100 to avoid current leakage. The process of recessing STI layer 102 is explained in details with respect to FIG. 9 above and hence is not discussed again to avoid repetition.

In an embodiment of the invention, the exposed second sub-channel region 101E of fins 101 is oxidized. In an embodiment where the entire ILD layer 102 is removed, oxidation process may also apply to at least the top surface of the substrate 100. The process of oxidizing the sub-channel region is explained in details with respect to FIG. 9 above and hence is not discussed again to avoid repetition. The oxidation of second sub-channel region 101E isolates lower portion 101D from the rest of the structure. In an embodiment, lower portion 101D of fin 101 is the second active channel region of fin 101. In other embodiments, additional channel layers may be formed below the lower portion 101D of fin 101 in accordance with the same method disclosed with respect to lower portion 101D.

Figure 13:
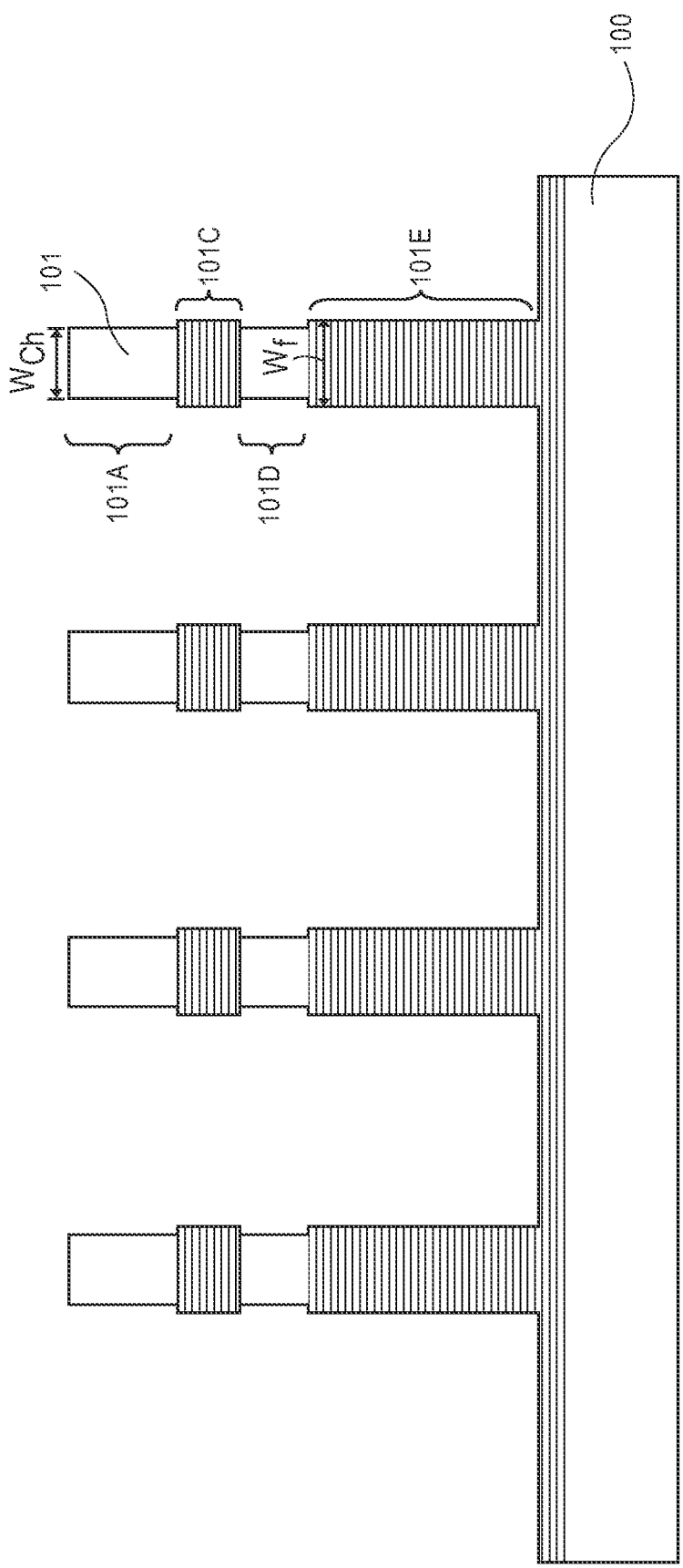

Referring to FIG. 13, hardmask(s) formed on the surfaces of fin 101 is removed. An embodiment may only have a hardmask on top portion 101a of fin 101 as explained in FIG. 9. Other embodiments may have multiple hardmasks to protect underlying fin structure as explained with respect to FIG. 12. Hardmask(s) may be removed using any known etchant that is selective to oxide portions, for example, the oxide portion of first and second sub-channel regions 101C and 101E. The selectivity of the etchant may be greater than 20:1 for hardmask material over oxide material. In an embodiment, the selectivity is greater than 50:1. In an embodiment where hardmask(s) are formed from silicon nitride and oxide layers are made from silicon oxide, hardmask(s) are selectively removed using a wet etchant such as, but not limited to hot phosphoric acid (H3PO4) solutions with water and hydrofluoric acid. Alternatively, dry etchants involving combinations of fluorocarbons, nitrogen trifluoride and oxygen may be used.

Referring to FIG. 13, in an embodiment, after the removal of hardmask(s), the width of fin may be lower in channel regions in compare to the rest of the fin structure. In an embodiment, because nitrogen plasma consumes the silicon on the surface of the fin in channel regions to form hardmask(s), width of the fin in channel regions $W_{Ch}$ are less than width of the rest of the fin structure $W_F$. For example, referring to FIG. 13, $W_{Ch}$ in top and lower portions 101A and 101D of fin 101 is less than the $W_F$ in first and second sub-channel regions 1010 and 101E. In an embodiment, the width of the fin structure $W_F$ before the removal of hardmasks may be 8-20 nm. In embodiment, nitrogen plasma consumes between 0.5-3.0 nm of the silicon surface of the fin structure to form nitrided silicon. A thinner channel region may provide a better control by the gate in FinFET and tri-gate devices.

Figure 14A:
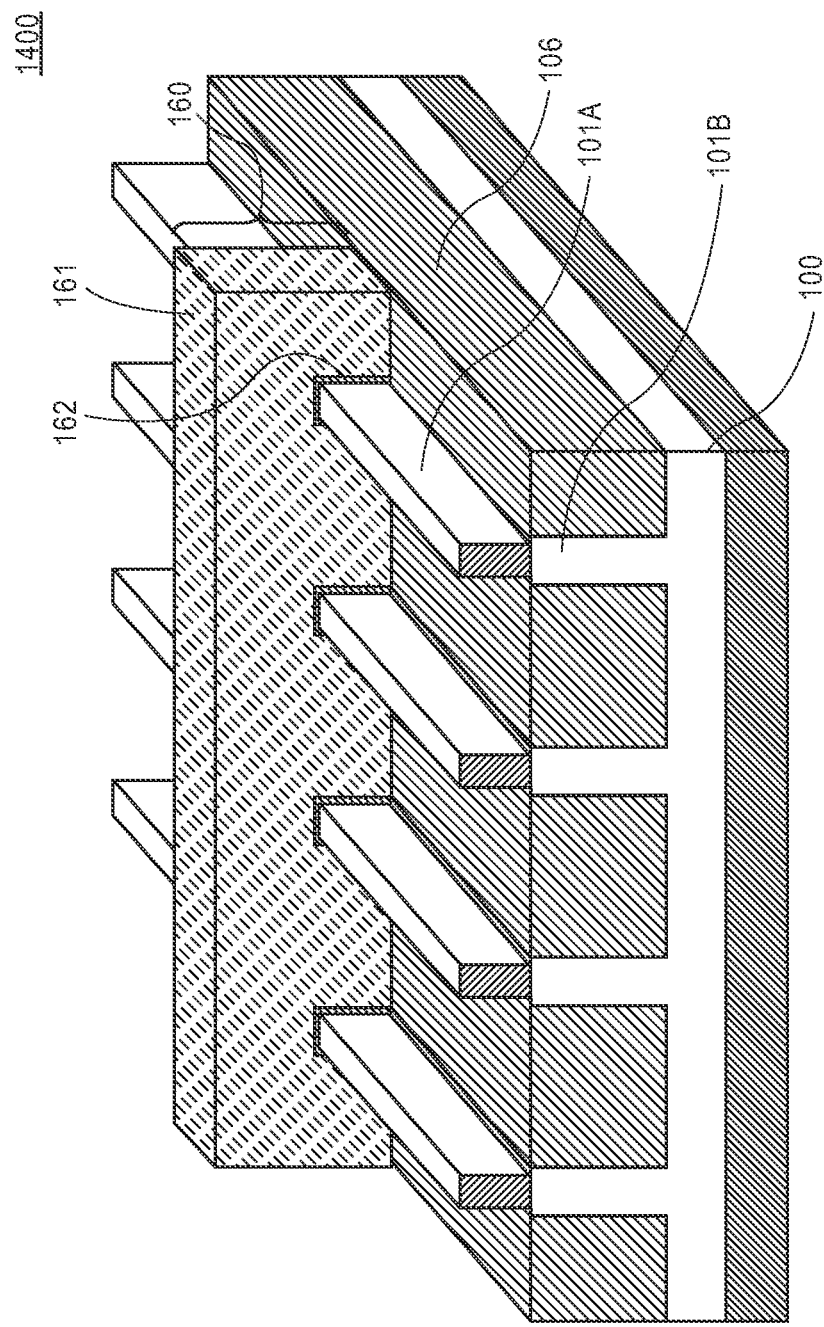
FIG. 14A illustrates a two-dimensional view of the non-planer device with gate structure formed around the single active channel region of the fins, in accordance with an embodiment of the present invention.
Figure 14B:
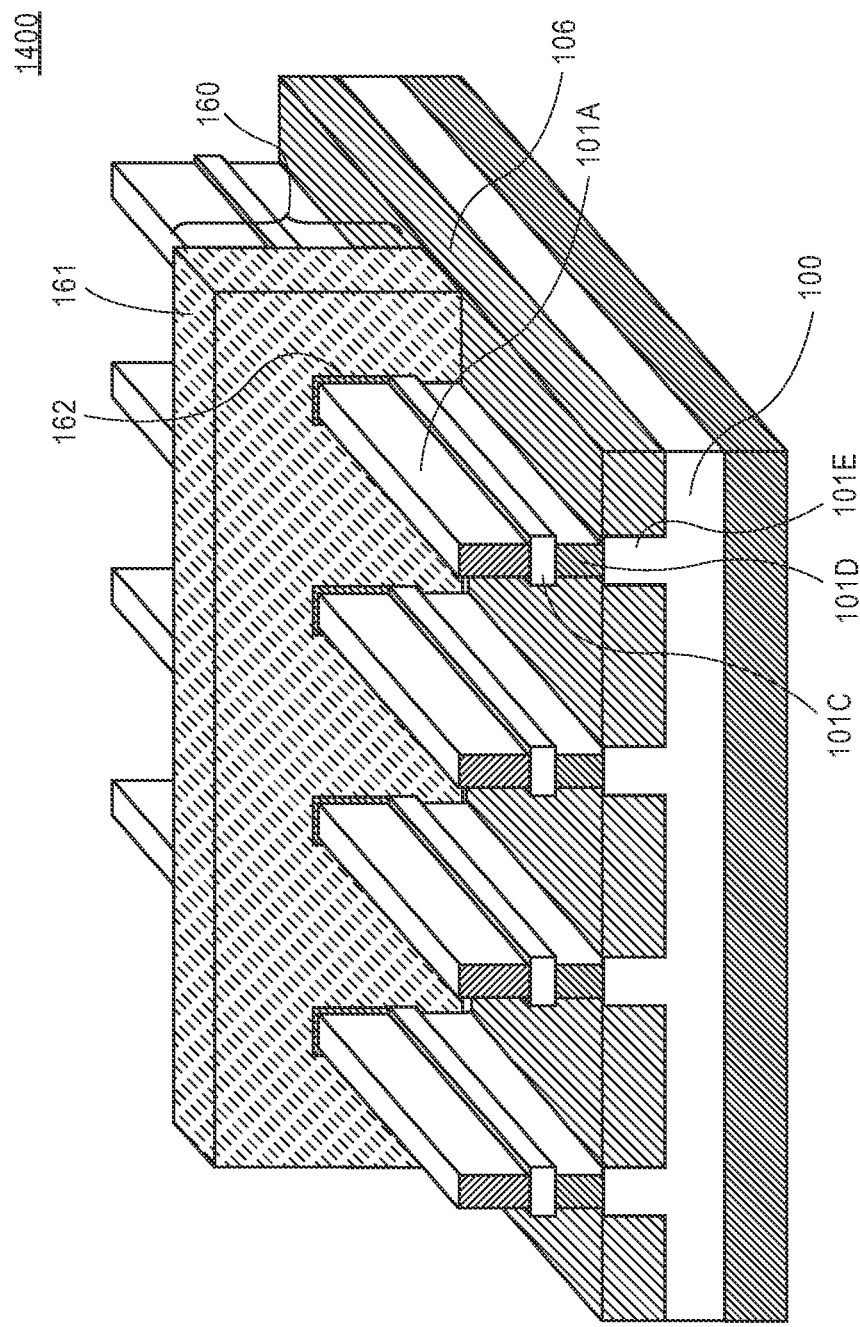
FIG. 14B illustrates a two-dimensional view of the non-planer device with gate structure formed around the multiple active channel regions of the fins, in accordance with an embodiment of the present invention.

Referring to FIGS. 14A and 14B, a semiconductor structure 1400 includes fin structures 101 and gate structure 160 is illustrated. FIG. 14A illustrates a single active channel region within the fins and FIG. 14B illustrate multiple active channel regions within the fins of device 1400. Referring to FIG. 14A, the fin structures include top portion 101A and sub-channel region 101B formed on substrate 100 and above isolation layer 106. Gate structure 160 is disposed over top portion 101A of the fin structure as well as over a portion of the isolation region between fins 101. Referring to FIG. 14B, the fin structures include active channel regions formed on top portion 101A and lower portion 101D. The first and second sub-channel regions 101B and 101E are formed underneath each active channel regions respectively. Gate structure 160 is disposed to cover at least the active channel regions of the fins as well as over a portion of the isolation region between fins 101. Gate structure 160 includes gate electrode 161 and gate dielectric layer 162.

Figure 15:
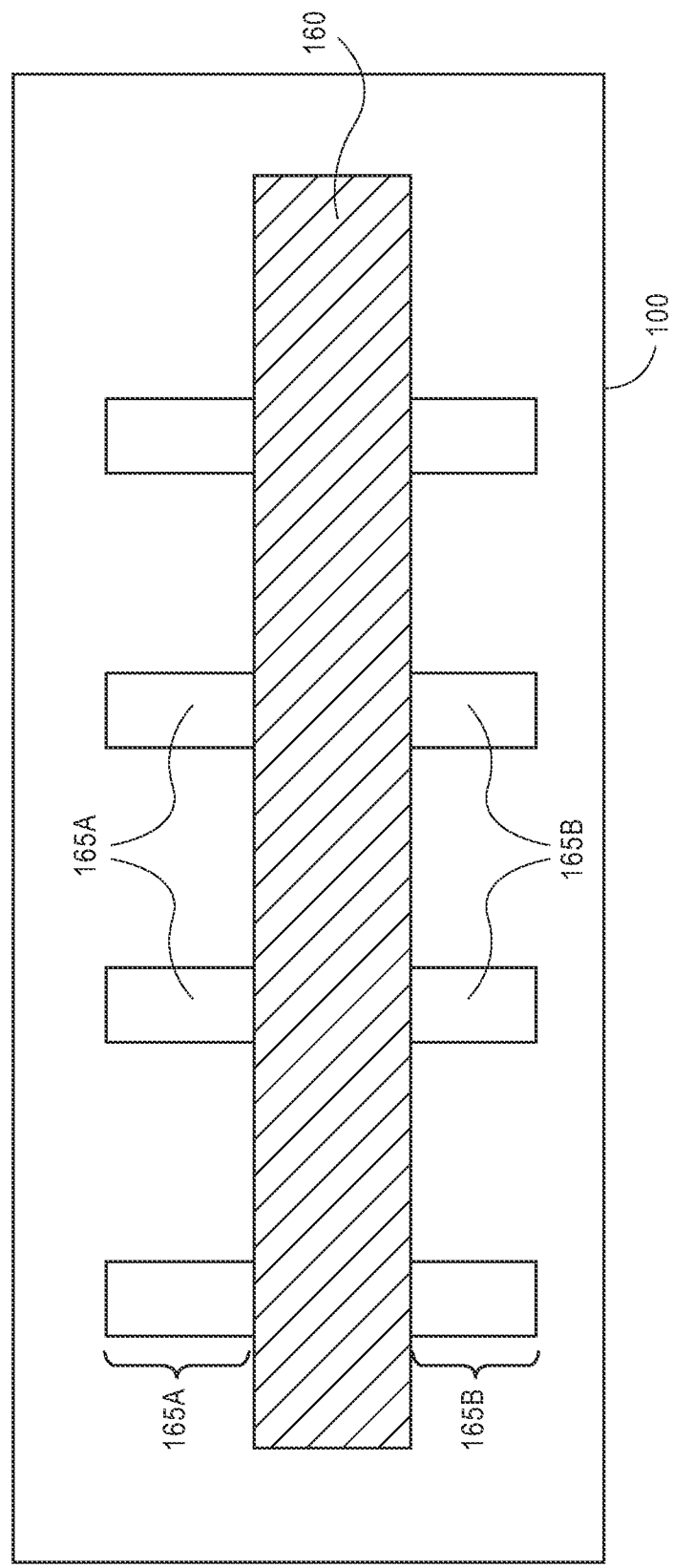

Referring to FIG. 15, gate structure 160 is shown as disposed over top portion 101A of the fin structure. Source and drain regions 165A and 165B of top portion 101A of fin 101 can be seen from this perspective. In one embodiment, the source and drain regions 165A and 165B are doped portions of original material of top portion 101A of fins 101. In another embodiment, the material of top portion 101A is removed and replaced with another semiconductor material, e.g., by epitaxial deposition. In either case, the source and drain regions 165A and 165B may extend below the height of dielectric layer 106, i.e., into the sub-channel region 101B.

In an embodiment, the semiconductor structure or device 1400 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate structure 160 surrounds at least a top surface and a pair of sidewalls of top portion 101A of fins 101.

Isolation layer 106 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 106 is composed of a dielectric material such as but not limited to, silicon dioxide, silicon oxy-nitride, silicon nitride, or carbon-doped silicon nitride.

Gate structure 160 may be composed of a gate electrode stack, which includes gate dielectric layer 162 and gate electrode layer 161. In an embodiment the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 100. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-work function-setting fill material formed above a metal work function-setting layer.

Furthermore, the gate structure 160 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Figure 16:
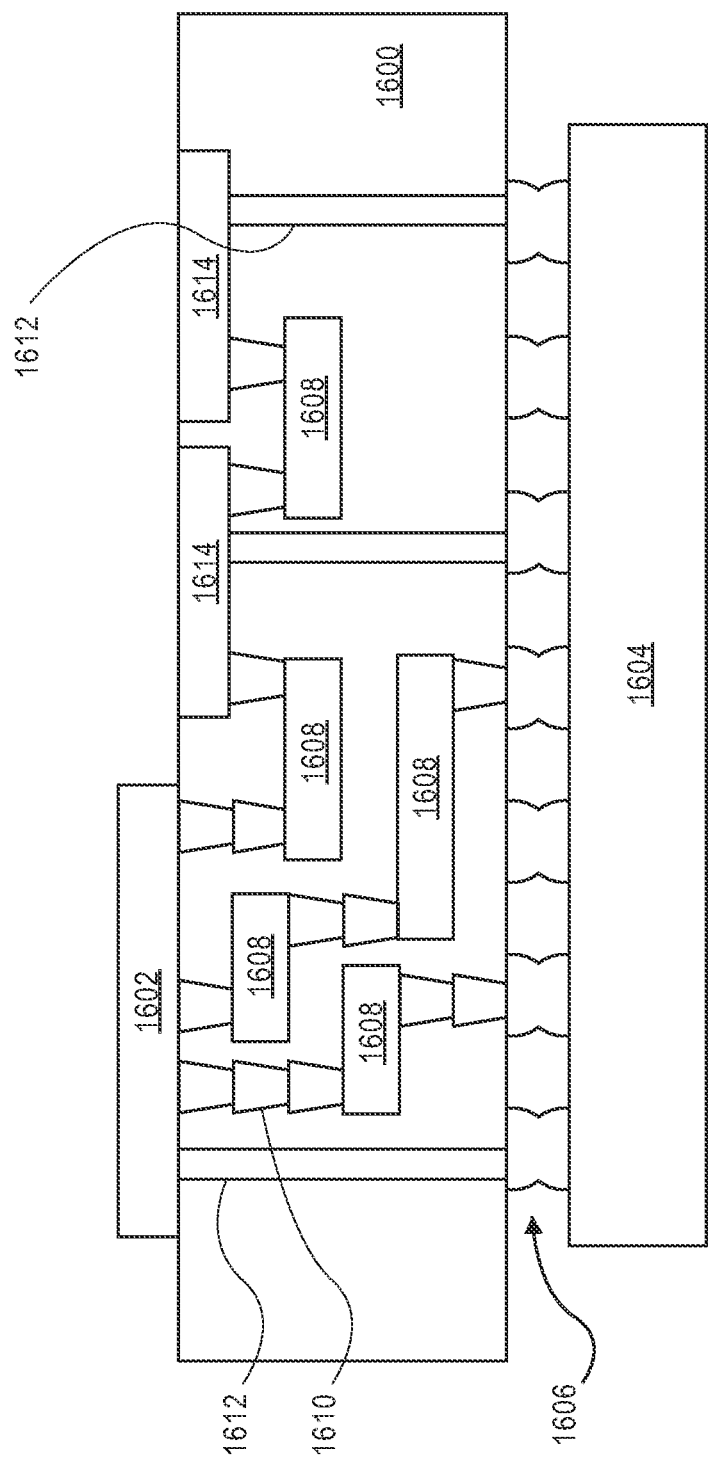
FIG. 16 is a cross-sectional illustration of an interposer implementing one or more embodiments of the invention, in accordance with an embodiment of the present invention.

FIG. 16 illustrates an interposer 1600 that includes one or more embodiments of the invention. The interposer 1600 is an intervening substrate used to bridge a first substrate 1602 to a second substrate 1604. The first substrate 1602 may be, for instance, an integrated circuit die. The second substrate 1604 may be, for instance, a memory module, a computer motherboard, or another integrated circuit die. Generally, the purpose of an interposer 1600 is to spread a connection to a wider pitch or to reroute a connection to a different connection. For example, an interposer 1600 may couple an integrated circuit die to a ball grid array (BGA) 1606 that can subsequently be coupled to the second substrate 1604. In some embodiments, the first and second substrates 1602/1604 are attached to opposing sides of the interposer 1600. In other embodiments, the first and second substrates 1602/1604 are attached to the same side of the interposer 1600. And in further embodiments, three or more substrates are interconnected by way of the interposer 1600.

The interposer 1600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1608 and vias 1610, including but not limited to through-silicon vias (TSVs) 1612. The interposer 1600 may further include embedded devices 1614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1600.

In accordance with embodiments of the invention, apparatuses or processes disclosed herein may be used in the fabrication of interposer 1600 or more specifically, the devices 1614 or any other structure that includes a transistor within the interposer.

Figure 17:
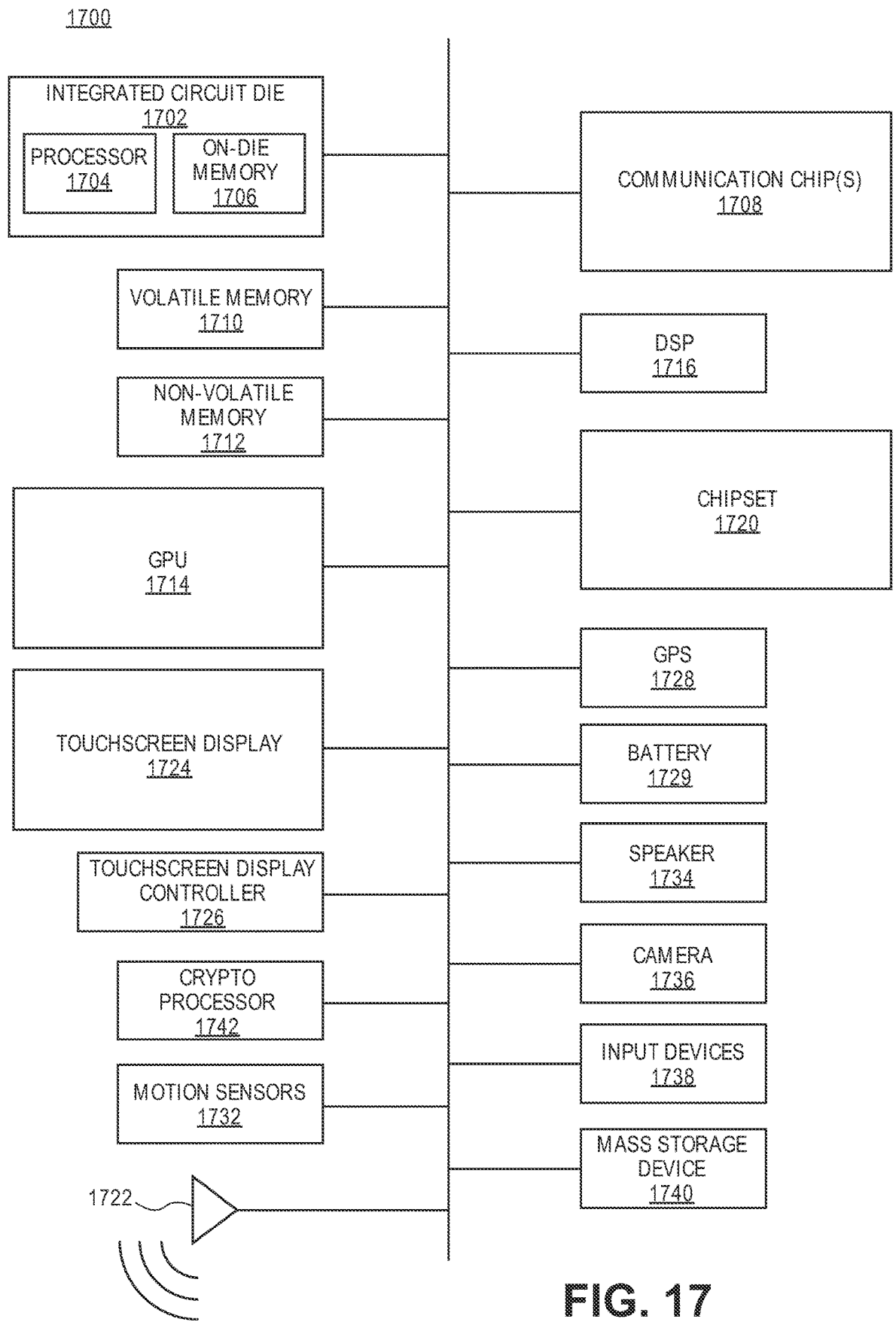
FIG. 17 is a schematic of a computing device built in accordance with an embodiment of the invention, in accordance with an embodiment of the present invention.

FIG. 17 illustrates a computing device 1700 in accordance with one embodiment of the invention. The computing device 1700 may include a number of components. In one embodiment, these components are attached to one or more motherboards. In an alternate embodiment, these components are fabricated onto a single system-on-a-chip (SoC) die rather than a motherboard. The components in the computing device 1700 include, but are not limited to, an integrated circuit die 1702 and at least one communication chip 1708. In some implementations the communication chip 1708 is fabricated as part of the integrated circuit die 1702. The integrated circuit die 1702 may include a CPU 1704 as well as on-die memory 1706, often used as cache memory, that can be provided by technologies such as embedded DRAM (eDRAM) or spin-transfer torque memory (STTM or STTM-RAM).

Computing device 1700 may include other components that may or may not be physically and electrically coupled to the motherboard or fabricated within an SoC die. These other components include, but are not limited to, volatile memory 1710 (e.g., DRAM), non-volatile memory 1712 (e.g., ROM or flash memory), a graphics processing unit 1714 (GPU), a digital signal processor 1716, a crypto processor 1742 (a specialized processor that executes cryptographic algorithms within hardware), a chipset 1721), an antenna 1722, a display or a touchscreen display 1724, a touchscreen controller 1726, a battery 1728 or other power source, a power amplifier (not shown), a global positioning system (GPS) device 1728, a compass 1730, a motion coprocessor or sensors 1732 (that may include an accelerometer, a gyroscope, and a compass), a speaker 1734, a camera 1736, user input devices 1738 (such as a keyboard, mouse, stylus, and touchpad), and a mass storage device 1740 (such as hard disk drive, compact disk (CD), digital versatile disk (DVD), and so forth).

The communications chip 1708 enables wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1700 may include a plurality of communication chips 1708. For instance, a first communication chip 1708 may be dedicated to shorter range wireless communications such as Wi-Fi and Bluetooth and a second communication chip 1708 may be dedicated to longer range wireless communications such as GPS, EDGE, CPRS, CDMA, WiMAX, LTE, Ev-DO, and others.

The processor 1704 of the computing device 1700 includes one or more devices, such as non-planar devices disclosed, that are formed in accordance with embodiments of the invention. The term "processor" may refer to any device or portion of a device that processes electronic data from registers and/or memory to transform that electronic data into other electronic data that may be stored in registers and/or memory.

The communication chip 1708 may also include one or more devices, such as non-planar devices disclosed in the disclosure.

In further embodiments, another component housed within the computing device 1700 may contain one or more devices, such as non-planar devices disclose in this disclosure.

In various embodiments, the computing device 1700 may be a laptop computer, a netbook computer, a notebook computer, an ultrabook computer, a smartphone, a tablet, a personal digital assistant (PDA), an ultra mobile PC, a mobile phone, a desktop computer, a server, a primer, a scanner, a monitor, a set-top box, an entertainment control unit, a digital camera, a portable music player, or a digital video recorder. In further implementations, the computing device 1700 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a method for fabricating a semiconductor device. The method includes forming a nanowire stack formed above the substrate. The nanowire stack includes a plurality of vertically-stacked nanowires separated by interlayer material. A source region and a drain region are formed on opposite ends of the nanowire stack. A gate structure including a pair of external sidewalls is formed on top of the nanowire stack and between the source and drain regions. The gate structure is removed. A portion of the interlayer material between the source and drain regions is removed to expose the surfaces of nanowires and a channel region of the device is defined. Internal spacers are formed from remaining interlayer material in interface regions between the channel region and the source and drain regions.

In one embodiment, forming the nanowire stack involves forming the plurality of vertically-stacked nanowires separated by silicon interlayer material.

In one embodiment, forming internal spacers involves growing silicon nitride by nitridation of the remaining silicon in the interface regions.

In one embodiment, the nitridation of the remaining silicon involves exposing surfaces within the channel region to plasma generated nitrogen.

In one embodiment, the plasma generated nitrogen selectively consumes the remaining silicon in the interface regions to form silicon nitride internal spacers.

In one embodiment, the plasma generated nitrogen is produced in a remote plasma chamber.

In one embodiment, the nanowire stack comprises a material selected from the group consisting of SiGe or Ge.

The method includes forming a plurality of fins on a substrate. An isolation layer is deposited between the plurality of fins such that at least a top portion of the fins are above a top surface of the isolation layer. Silicon nitride is grown on the top portion of the fins to form hardmasks. The isolation layer is recessed to expose a first sub-channel portion of the fins. The first sub-channel portion of the fins is oxidized. And the hardmasks are removed.

In one embodiment, the top portion of the fins are made from silicon.

In one embodiment, forming hardmasks involves nitriding the top portion of the fins by consuming silicon of the exposed surfaces.

In one embodiment, nitriding the top portion of the fins involves exposing the surfaces of the top portion of the fins to plasma generated nitrogen.

In one embodiment, the plasma generated nitrogen is produced in a remote plasma chamber.

In one embodiment, the method further involves recessing the isolation layer to expose a top surface of the substrate between the plurality of the fins and oxidizing the exposed top surface of the silicon substrate.

In an embodiment, a semiconductor structure includes a nanowire stack disposed above a substrate, the nanowire stack having a plurality of vertically-stacked nanowires. A source region and a drain region on opposite ends of the nanowire stack. A gate structure wrapped around each of the plurality of nanowires, defining a channel region of the device between the source and drain regions. And diffuse interface regions between the channel region and the source and drain regions of each two adjacent nanowires.

In an embodiment, the interface regions include silicon nitride.

In one embodiment, the nanowires include a material selected from the group consisting of SiGe or Ge.

In an embodiment, a semiconductor structure includes a semiconductor substrate and at least one semiconductor fin disposed above the semiconductor substrate. The fin includes a first active channel region on a top portion of the fin, a first oxidized region on a first sub-channel portion of the fin, the first sub-channel portion isolates the top portion of the fin from a rest of the semiconductor device, and a second active channel region below the first sub-channel portion of the fin. The first and second active channel regions of the fin are thinner than the first sub-channel portion of the fin.

In one embodiment, the semiconductor substrate includes a top oxidized portion.

In one embodiment, the semiconductor device further includes a second oxidized region on a second sub-channel portion of the fin below the second active channel region.

In one embodiment, the semiconductor structure further includes a gate structure over the first and second active channel regions of the fin.

What is claimed is:

1. A semiconductor device, comprising:
a nanowire stack disposed above a substrate, the nanowire stack having a plurality of vertically-stacked nanowires;
a source region and a drain region on opposite ends of the nanowire stack;
a gate structure wrapped around each of the plurality of nanowires, defining a channel region of the device between the source and drain regions; and
diffuse interface regions between the channel region and the source and drain regions of each two adjacent nanowires, wherein the diffuse interface regions each comprise a non-linear concentration gradient of nitrogen.

2. The semiconductor device of claim 1, wherein the interface regions comprise silicon nitride.

3. The semiconductor device of claim 2, wherein the nanowires comprise a material selected from the group consisting of SiGe or Ge.

4. A method for fabricating a semiconductor device, comprising:
forming a nanowire stack above the substrate, the nanowire stack having a plurality of vertically-stacked nanowires separated by interlayer material;
forming a source region and a drain region on opposite ends of the nanowire stack;
forming a gate structure having a pair of external sidewalls on top of the nanowire stack and between the source and drain regions;
removing the gate structure;
removing a portion of the interlayer material between the source and drain regions to expose the surfaces of nanowires and defining a channel region of the device; and
forming internal spacers by modifying remaining interlayer material in interface regions between the channel region and the source and drain regions.

5. The method of claim 4, forming the nanowire stack comprises forming the plurality of vertically-stacked nanowires separated by silicon interlayer material.

6. The method of claim 5, wherein forming internal spacers comprises growing silicon nitride by nitridation of the remaining silicon in the interface regions.

7. The method of claim 6, wherein the nitridation of the remaining silicon comprises exposing surfaces within the channel region to plasma generated nitrogen.

8. The method of claim 7, wherein the plasma generated nitrogen selectively consumes the remaining silicon in the interface regions to form silicon nitride internal spacers.

9. The method of claim 8, wherein the plasma generated nitrogen is produced in a remote plasma chamber.

10. The method of claim 5, wherein the nanowire stack comprises a material selected from the group consisting of SiGe or Ge.

11. A method for fabricating a semiconductor device, comprising:
forming a nanowire stack above the substrate, the nanowire stack having a plurality of vertically-stacked nanowires separated by silicon interlayer material;
forming a source region and a drain region on opposite ends of the nanowire stack;
forming a gate structure having a pair of external sidewalls on top of the nanowire stack and between the source and drain regions;
removing the gate structure;
removing a portion of the silicon interlayer material between the source and drain regions to expose the surfaces of nanowires and defining a channel region of the device; and
forming internal spacers from remaining silicon interlayer material in interface regions between the channel region and the source and drain regions, wherein the forming internal spacers comprises growing silicon nitride by nitridation of the remaining silicon in the interface regions.

12. The method of claim 11, wherein the nitridation of the remaining silicon comprises exposing surfaces within the channel region to plasma generated nitrogen.

13. The method of claim 12, wherein the plasma generated nitrogen selectively consumes the remaining silicon in the interface regions to form silicon nitride internal spacers.

14. The method of claim 13, wherein the plasma generated nitrogen is produced in a remote plasma chamber.

15. The method of claim 11, wherein the nanowire stack comprises a material selected from the group consisting of SiGe or Ge.

* * * * *